(12) United States Patent
Sugibayashi et al.

(10) Patent No.: US 6,515,511 B2
(45) Date of Patent: Feb. 4, 2003

(54) SEMICONDUCTOR INTEGRATED CIRCUIT AND SEMICONDUCTOR INTEGRATED CIRCUIT DEVICE

(75) Inventors: Tadahiko Sugibayashi, Tokyo (JP); Tohru Mogami, Tokyo (JP)

(73) Assignee: NEC Corporation, Tokyo (JP)

( * ) Notice: Subject to any disclaimer, the term of this patent is extended or adjusted under 35 U.S.C. 154(b) by 154 days.

(21) Appl. No.: 09/785,089

(22) Filed: Feb. 16, 2001

(65) Prior Publication Data

US 2001/0015450 A1 Aug. 23, 2001

(30) Foreign Application Priority Data

Feb. 17, 2000 (JP) ........................................ 2000-038972

(51) Int. Cl.[7] ........................................... H03K 19/177
(52) U.S. Cl. ............................. 326/41; 326/38; 326/102
(58) Field of Search ..................... 326/37–41, 101–103

(56) References Cited

U.S. PATENT DOCUMENTS 5,212,652 A * 5/1993 Agrawal et al. ............... 326/41
6,331,790 B1 * 12/2001 Or-Bach et al. ............... 326/38

FOREIGN PATENT DOCUMENTS

| JP | 05-062474 | 3/1993 |
| JP | 06-104405 | 4/1994 |
| JP | 07-032200 | 2/1995 |
| JP | 09-148440 | 6/1997 |
| JP | 11-017107 | 1/1999 |

* cited by examiner

*Primary Examiner*—Don Phu Le
(74) *Attorney, Agent, or Firm*—Katten, Muchin, Zavis, Rosenman

(57) ABSTRACT

A semiconductor integrated circuit device has a plurality of basic cells. The basic cells are placed in a matrix form, and are formed on a semiconductor substrate. Each of the basic cells includes a wire selection portion and a logic gate portion. The logic gate portion has a MOS transistor. The wire selection portion has a thin-film transistor serving as a transfer gate. The wire selection portion is placed over the logic gate portion via an interlayer insulating film.

24 Claims, 22 Drawing Sheets

SEMICONDUCTOR INTEGRATED CIRCUIT AND SEMICONDUCTOR INTEGRATED CIRCUIT DEVICE

BACKGROUND OF THE INVENTION

This invention broadly relates to a semiconductor integrated circuit and a semiconductor integrated circuit device.

Generally, an FPGA (Field Programmable Gate Array) has been well-known as a logic semiconductor integrated circuit having a plurality of transfer gates.

Herein, it is to be noted that the FPGA means a gate array type semiconductor integrated circuit in which a user can freely change logic.

Meanwhile, disclosure has been made about the conventional general structure of the FPGA in Japanese Unexamined Patent Publication No. Hei. 9-148440, as illustrated in FIG. 1.

In such a conventional example, variable logic blocks PLB and switch matrixes SMX are alternatively arranged in vertical and lateral directions at a central portion of a chip SUB.

With this structure, the variable logic block PLB can change a logic function while the switch matrix SMX can change a connection state between wiring patterns.

Further, a X-decoder circuit X-DEC and a Y-decoder and writing circuit Y-DEC & WDR, which selects memory cells placed in the variable logic block PLB and the switch matrix SMX to write data signals, are arranged around the variable logic blocks PLB and the switch matrixes SMX.

Moreover, input-output buffer cells IOB are arranged along the periphery of the chip so as to surround these circuits.

The variable logic block PLB includes the transfer gates for changing the logic, memory cells, and inverters for controlling signals given to the transfer gates.

On the other hand, the switch matrix SMX comprises the transfer gates and the memory cells for controlling ON/OFF operations of the transfer gates. Herein, the transfer gate is composed of an n-channel MOS transistor.

Each of the variable logic block PLB and the switch matrix SMX is occupied by the transfer gates with approximately ⅙ of the total number of the transistors.

Referring to FIG. 2, a p-type well 102 is formed on a silicon substrate 101 in a SMX formation region while a p-well 103 is formed in a PLB formation region.

In this event, a MOSFET Qn1 having a gate electrode G1 and source/drain regions 105 is formed in the SMX formation region while a MOSFET Qn2 having a gate electrode G2 and source/drain regions 106 is formed in the PLB formation region.

Further, interlayer insulating films 111 to 115 are deposited on the silicon substrate 101. Moreover, a first layer metal wiring pattern M1, a second metal layer wiring pattern M2, a third layer metal wiring pattern M3, and a fourth layer metal wiring pattern M4 are placed between the interlayer insulating films.

An output signal of the PLB formation region is produced from the drain region of the MOSFET Qn2, and is transmitted to the SMX formation region via the metal wiring patterns M1, M2, and M3.

Further, the signal is sent to the fourth layer metal wiring pattern M4 through the MOSFT Qn1 serving as a switching transistor, and is transmitted to another switch matrix SMX (not shown) via another variable logic block PLB. Herein, the ON/OFF operation of the MOSFET Qn1 is controlled by a memory device, such as, an SRAM.

In such a programmable logic integrated circuit, a plurality of transfer gates are connected to the wiring pattern. However, the transfer gate is structured by the MOS transistor formed on the silicon substrate in the conventional example.

In consequence, the junction capacitance of the transistor parasites to the wiring pattern, and thereby, the wiring pattern inevitably has large parasitic capacitance.

Further, every when the transfer gate is inserted into the wiring pattern, the wiring pattern is pulled down from the third layer and the fourth layer into the substrate surface. Thereafter, the wiring pattern is pulled up to an upper layer.

Consequently, a wiring length becomes long, and parasitic capacitance is more increased with an increase of parasitic resistance.

Further, all transistors including the transfer gates are formed on the same plane in the conventional example. As a result, each of the switch matrix SMX and the variable logic block PLB has a large area.

To this end, the number of the gates, which can arrange for one chip of the FPGA, is reduced so as to restrict an applied system.

Such a problem is not inherent to the FPGA, and is common to various programmable devices which includes a plurality of switches consisting of the transfer gates other than the FPGA.

Moreover, a chip having a learning function, such as, a digital neuron chip LSI, also includes a plurality of transfer gates, and has the above-mentioned problem.

SUMMARY OF THE INVENTION

It is therefore an object of this invention to provide an integrated circuit and device which are capable of reducing parasitic capacitance and parasitic resistance for a wiring pattern of an integrated circuit, such as, a FPGA, and of achieving a high speed operation of an integrated circuit having a plurality of transfer gates.

It is another object of this invention to provide an integrated circuit and device which are capable of realizing high density and high integration of an integrated circuit, and of increasing the number of transfer gates.

According to this invention, a semiconductor integrated circuit device has a plurality of basic cells. The basic cells are placed in a matrix form, and are formed on a semiconductor substrate.

With this structure, each of the basic cells includes a wire selection portion and a logic gate portion.

Further, the logic gate portion has a MOS transistor.

Moreover, the wire selection portion has a thin-film transistor (TFT) serving as a transfer gate.

In this condition, the wire selection portion is placed over the logic gate portion via an interlayer insulating film.

In this event, the thin-film transistor may be an n-channel enhancement type or an n-channel depletion type thin-film transistor.

Further, a pair of wiring patterns are formed in the interlayer insulating film, and the thin-film transistor is placed between the wiring patterns.

The thin-film transistor preferably comprises any one of a lateral type and a vertical type.

The thin-film transistor may have at least a channel region, and the channel region may be formed by a non-doped polysilicon film.

More specifically, the transfer gate, which can change the connection path between the wiring patterns, is formed on the semiconductor substrate via the insulating film. The junction capacitance of the TFT formed on the insulating film is excessively small in comparison with the bulk-type transistor.

Further, it is possible to arrange the transfer gate between the wiring patterns. Thereby, it is prevented the wiring pattern from being lengthened by inserting the transfer gate into the wiring pattern. Consequently, the parasitic capacitance of the wiring pattern can be more reduced, and further, the parasitic resistance can be lowered also.

Accordingly, the high speed of the circuit operation can be realized by the structuring the transfer gate with the TFT in the logic integrated circuit, such as, the FPGA, in which the transfer gate for switching a plurality of wiring patterns is connected to the wiring pattern.

Further, the transfer gate, which is can change the connection path between the wiring pattern, is formed on the semiconductor substrate via the insulating film, as mentioned above. Consequently, the number of the devices arranged on the semiconductor substrate as the bulk device is reduced, and thereby, the chip area can be reduced also. If the chip areas are identical to each other, the gate number can be increased with the increase of the device number.

Meanwhile, it has been well known that the three-dimensional integrated circuit provides the high integration. However, a part of device has been not conventionally structured by the TFT in the logic integrated circuit, such as, the FPGA. This is because the TFT has a delay operation, a large leak, and a low heat-dissipating characteristic.

Therefore, it has been considered that the logic integrated circuit having high function and high performance can not be realized by using the TFT.

In the meantime, the transfer gate for changing the wiring path in the logic integrated circuit such as the FPGA has the following advantages.

(1) The ratio of the transfer gates for the total device number is equal to about ¼ to ¹/₁₀.
(2) The operation (namely, the ON/OFF operation) is performed only when initialization, such as, power supply introduction, is carried out.
(3) Only limited transfer gates are kept to the conductive state while a large number of transfer gates are kept to the off state.

In the case where the transfer gate having the above-mentioned advantages is realized by the TFT, the disadvantages inherent to the TFT are removed or eliminated as follows.

Namely, the transfer gate is turned on/off only when the initialization, such as, the power supply introduction is carried out irrelevant of the logic operation of the integrated circuit. Consequently, the operation speed will not cause any problems.

Further, the leak current during the off state of the TFT can be suppressed by lengthening the gate length. The size of the transistor can be enlarged by the following reason.

Namely, only a part of the total device is formed as the TFT, and the remaining devices are formed as the bulk type devices. Consequently, the TFT formed at the upper layer of the bulk type device has a margin in area. Even if the integrated circuit is enlarged, the integration thereof will be not reduced.

Meanwhile, when the gate length is lengthened, the operation speed may be lowered. However, the operation speed does not cause any problems in such a TFT used for the application of this invention.

Further, a small number of TFTs are kept to the on state while a large number of TFTs are kept to the off state. Consequently, even when the heat-dissipating performance is degraded in some TFTs, the heat-generation almost does not occur.

Thus, the operation speed of the logic integrated circuit can be increased. Further, the number of the mountable transfer gates can be increased by realizing the high integration and the high density.

As described above, the transfer gate as the switch between the signals can be selectively formed in the three-dimensional form. Thereby, the parasitic capacitance inherent to the wiring pattern can be largely reduced. Consequently, the high-speed operation can be realized in the programmable device or the neuron device.

Further the chip area can be reduced without the increase of the leak current and without the heat generation by the selective three-dimensional form of the transfer gate.

Moreover, the number of the mountable basic cells or neurons per one chip can be increased, and the application range of the programmable device or the neuron device can be widened largely.

DESCRIPTION OF PREFERRED EMBODIMENTS

Hereinafter, description will be made about various embodiments according to this invention with drawings.

(First embodiment)

Description will be made about a first embodiment according to this invention.

Figure 1:
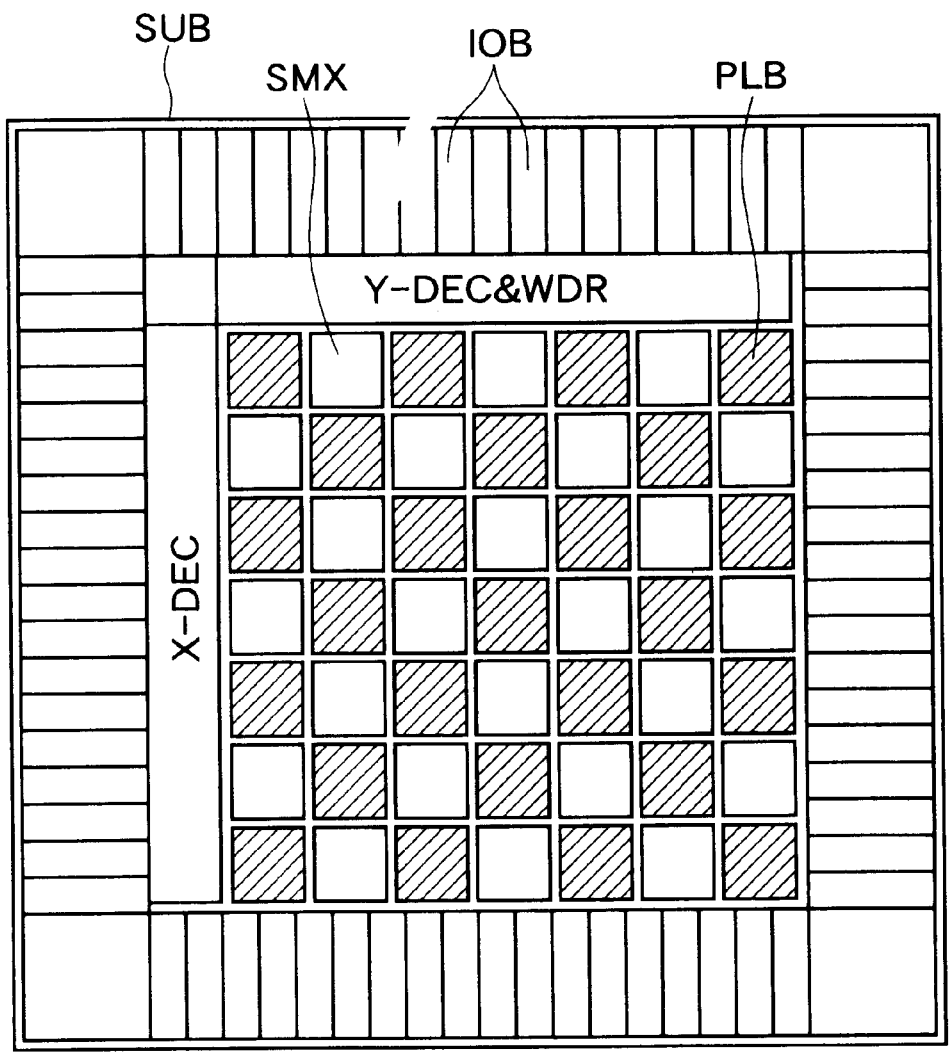
FIG. 1 is a layout diagram of the conventional example.
Figure 2:
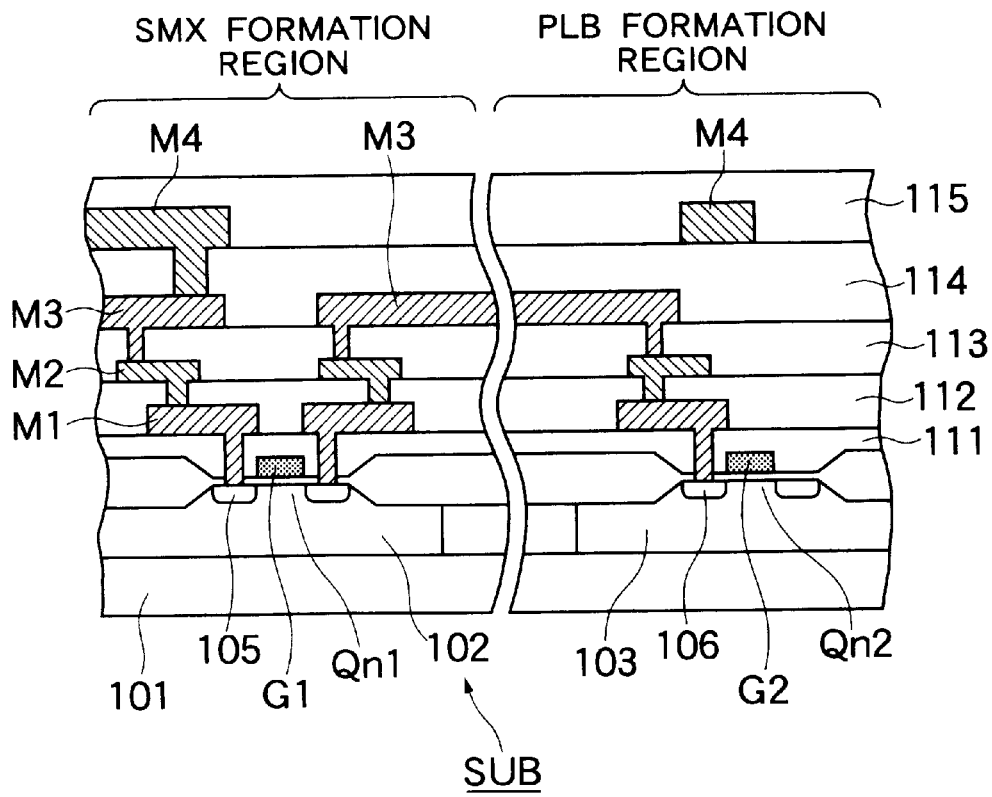
FIG. 2 is a cross sectional view of the conventional example.
Figure 3:
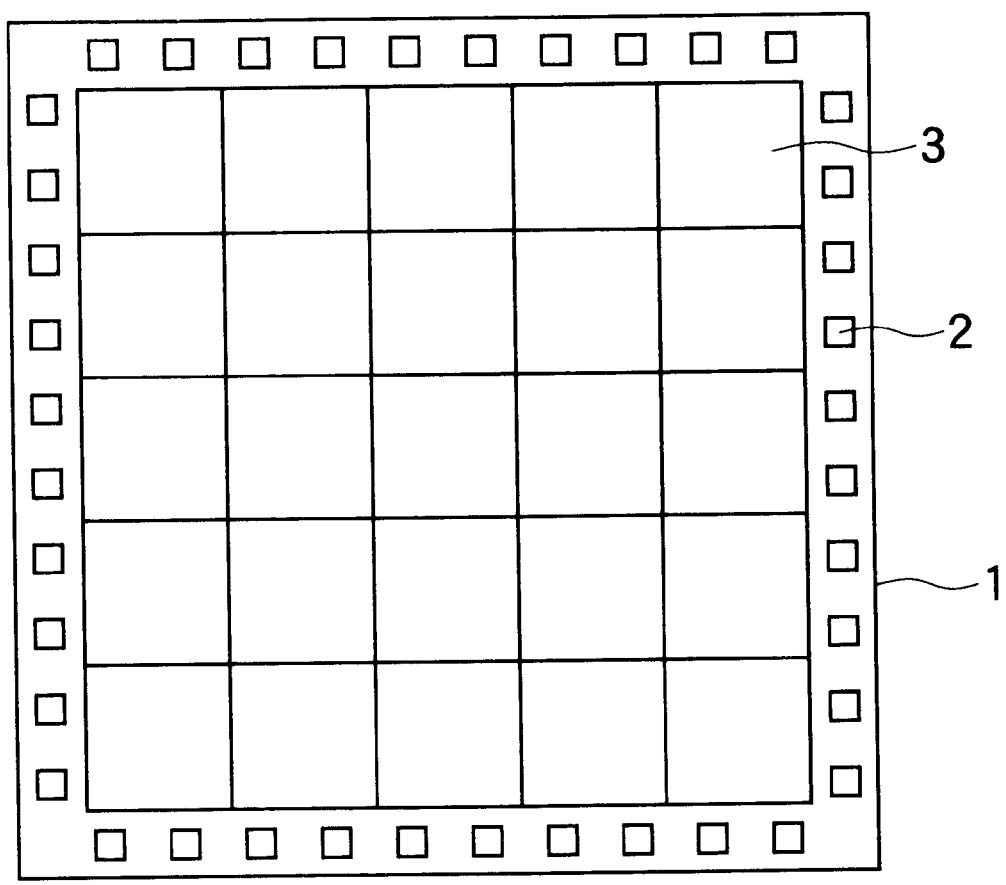
FIG. 3 is a general layout diagram of a first embodiment according to this invention.

As illustrated in FIG. 3, input-output pads 2 are arranged at a periphery portion of a chip 1, and basic cells 3 are placed in a matrix form at a center portion thereof.

Figure 4:
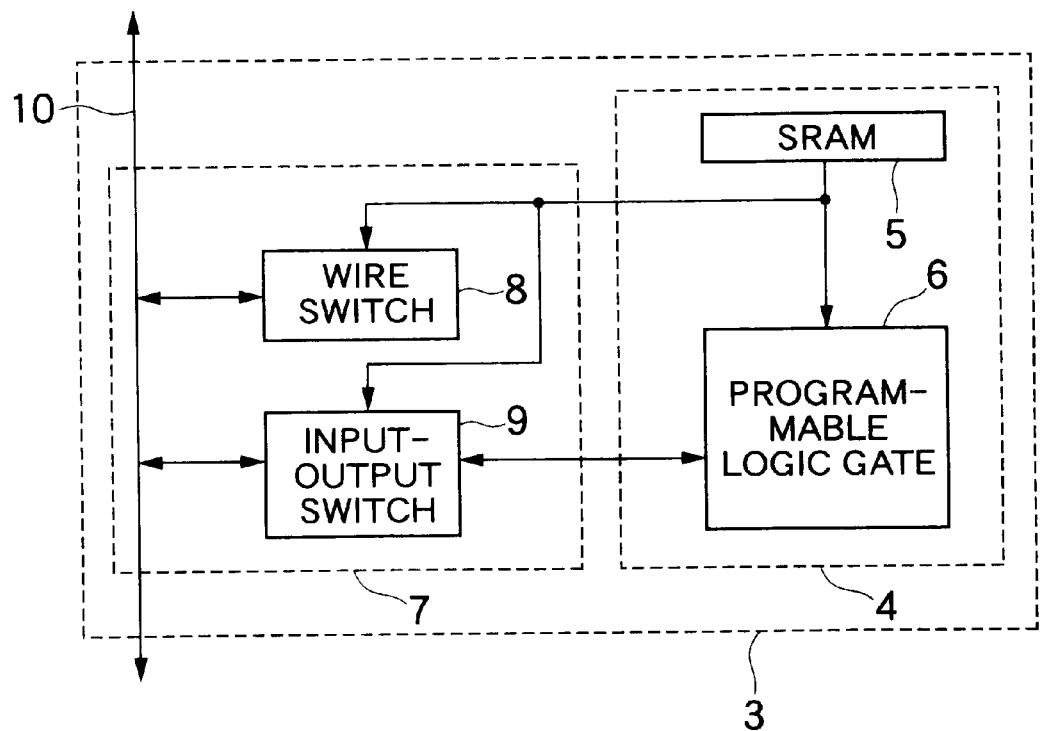
FIG. 4 is a block diagram of a first embodiment according to this invention.

As illustrated in FIG. 4, the basis cell is composed of a logic gate portion 4 and a wire selection portion 7. The logic gate portion 4 includes a programmable logic gate 6, and an SRAM 5 for programming the programmable logic gate 6.

Further, the wire selection portion 7 is provided with a wire switch 8 for switching a connection between wire lines of a basic cell signal bus 10, and an input-output switch 9 for switching a connection between a wire line of the bus 10 and input-output terminal of the programmable logic gate 6.

An ON/OFF operation of each switch 8,9 in the wire selection portion 7 is controlled by a data signal stored in the SRAM 5. Herein, the data signal can be written into the SRAM 5 by the use of a ROM, an EPROM, and an EEPROM when a power supply is introduced.

Figure 5:
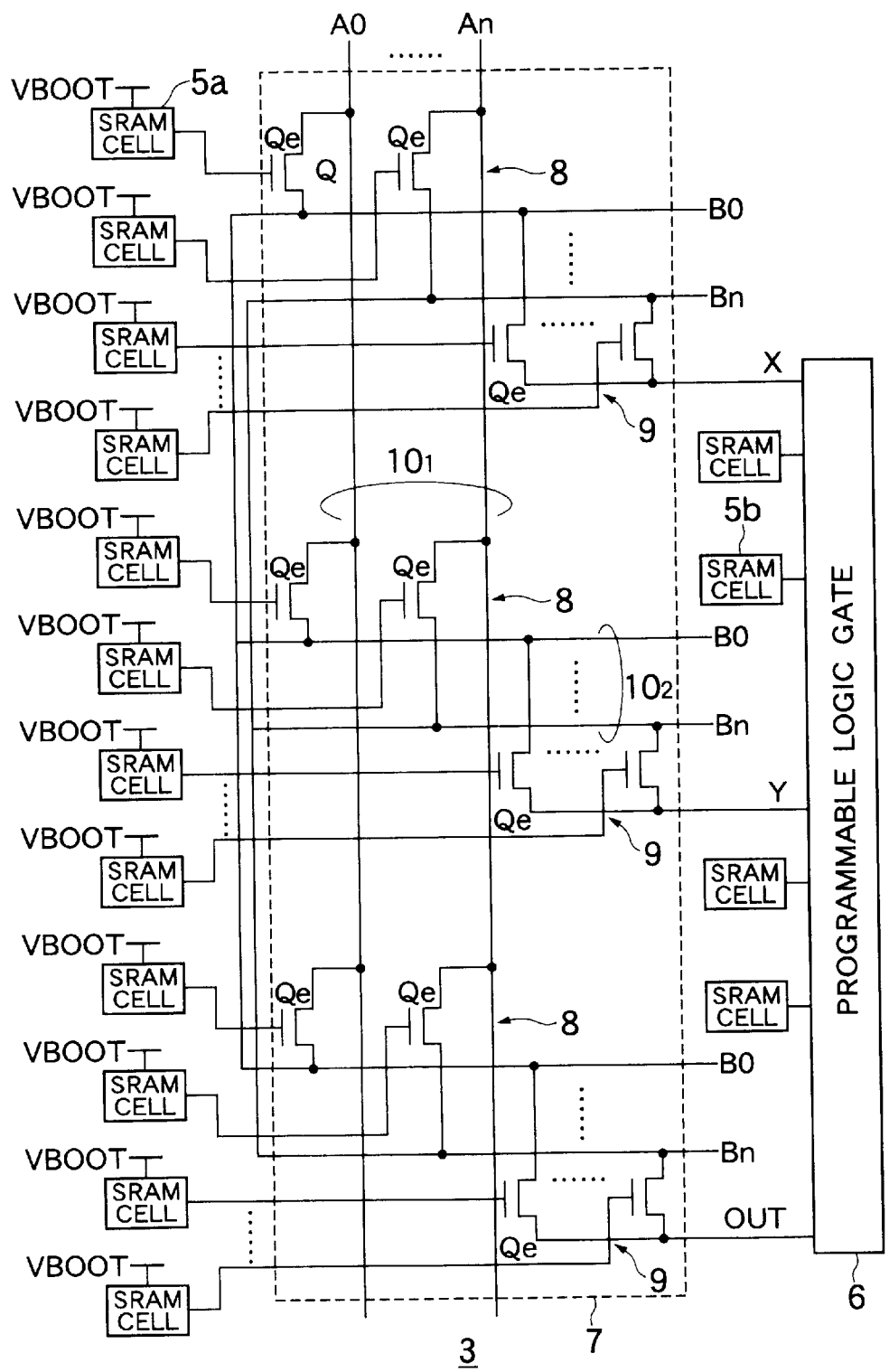
FIG. 5 is a partial circuit diagram of a first embodiment.

In the basic cell 3 illustrated in FIG. 5, a Y-direction signal bus 10$_1$ is composed of wiring lines A0 to An while a X-direction signal bus 10$_2$ is composed of wiring lines B0 to Bn. A wire connection between the Y-direction signal bus 10$_1$ and the X-direction signal bus 10$_2$ is changed by an n-channel enhancement type TFT (thin-film transistor) Qe. Herein, the TFT Qe is a transfer gate serving as a switch 8 between wiring lines.

A wire connection between the X-direction signal bus 10$_2$ and input terminals X,Y and an output terminal OUT of the programmable logic gate 6 is changed by an n-channel enhancement type TFT Qe. Herein, the TFT Qe is a transfer gate serving as a switch 9 for input-output.

A SRAM cell 5a connected to a TFT gate is driven by a voltage VBOOT higher than a power supply voltage VCC of a normal logic circuit. In this event, VBOOT is generally produced by a rising circuit placed inside a chip.

Output amplitude from the SRAM, namely amplitude of a voltage applied to a gate of the TFT serves as VBOOT-GND (ground potential), and thereby, signal amplitude of the bus serves as VCC-GND.

Thus, the transfer gate can have the same signal amplitude VCC-GND as a CMOS in condition that parasitic capacitance of the bus can be lowery suppressed.

Even when the output amplitude of the SRAM becomes higher as VBOOT-GND, heat will not generate. This is because the SRAM is once operated during programming by reducing consumption current of the SRAM during a non-operation state.

Figure 6:
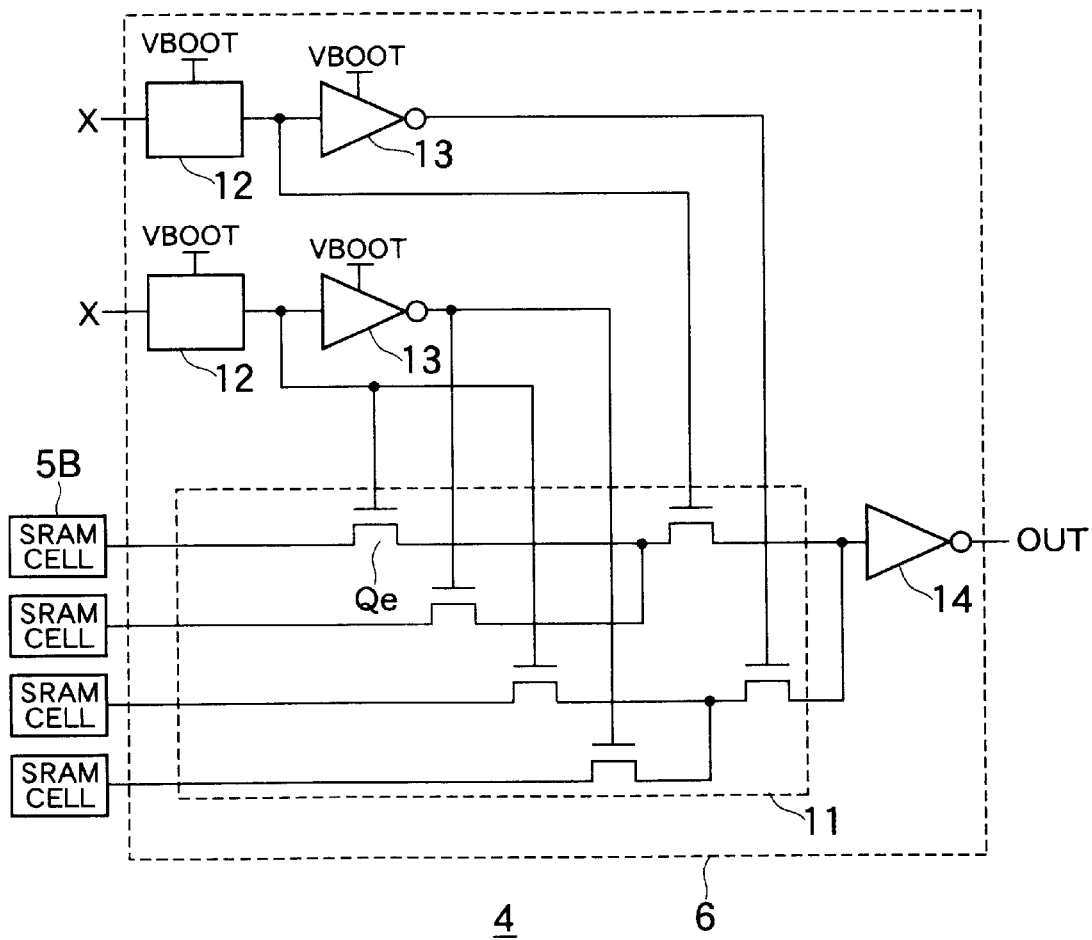
FIG. 6 is a partial circuit diagram of a first embodiment.

As illustrated in FIG. 6, the programmable logic gate 6 is a logic gate having two inputs and one output including input terminals X ,Y, and an output terminal OUT.

Further, the programmable gate 6 is composed of a switch portion 11, a level converter 12 for producing an input voltage of the gate of the transfer gate in the switch portion 11, an inverter 13, and an output buffer 14 for inputting the output of the switch portion 11.

Herein, the transfer gate of the switch portion 11 is also composed of the n-channel enhancement type TFT Qe in this embodiment. To this end, the level converter 12 and the inverter 13 are driven by a rising voltage VBOOT, and VBOOT/GND as output signal amplitude thereof is applied to the gate of the TFT Qe.

Under this circumstance, two TFTs are put into conductive states among the TFTs in the switch portion 11 on the basis of a signal given to input terminals X,Y. Thereby, either one of signals stored among four SRAM cells 5b is given to the output buffer 14.

In this embodiment, the transfer gate in the logic gate portion is also composed of the TFTs. Thereby, the logic gate portion itself constitutes a three-dimensional form so as to reduce the area of the basic cell.

In the meantime, the transfer gate in the programmable logic gate 6 is different from the transfer gate in the wire selection portion 7, and is a device in which an ON/OFF operation is repeated during an operation of a logic integrated circuit.

Further, the level converter 12 for driving the TFT or the inverter 13 consumes large current different from the SRAM cell 5b. Consequently, the switch portion 11 of the logic gate portion 4 can be structured by the TFT only where the heat of the TFT does not cause any problems and the rising voltage VBOOT can be supplied from an external portion.

Figure 7:
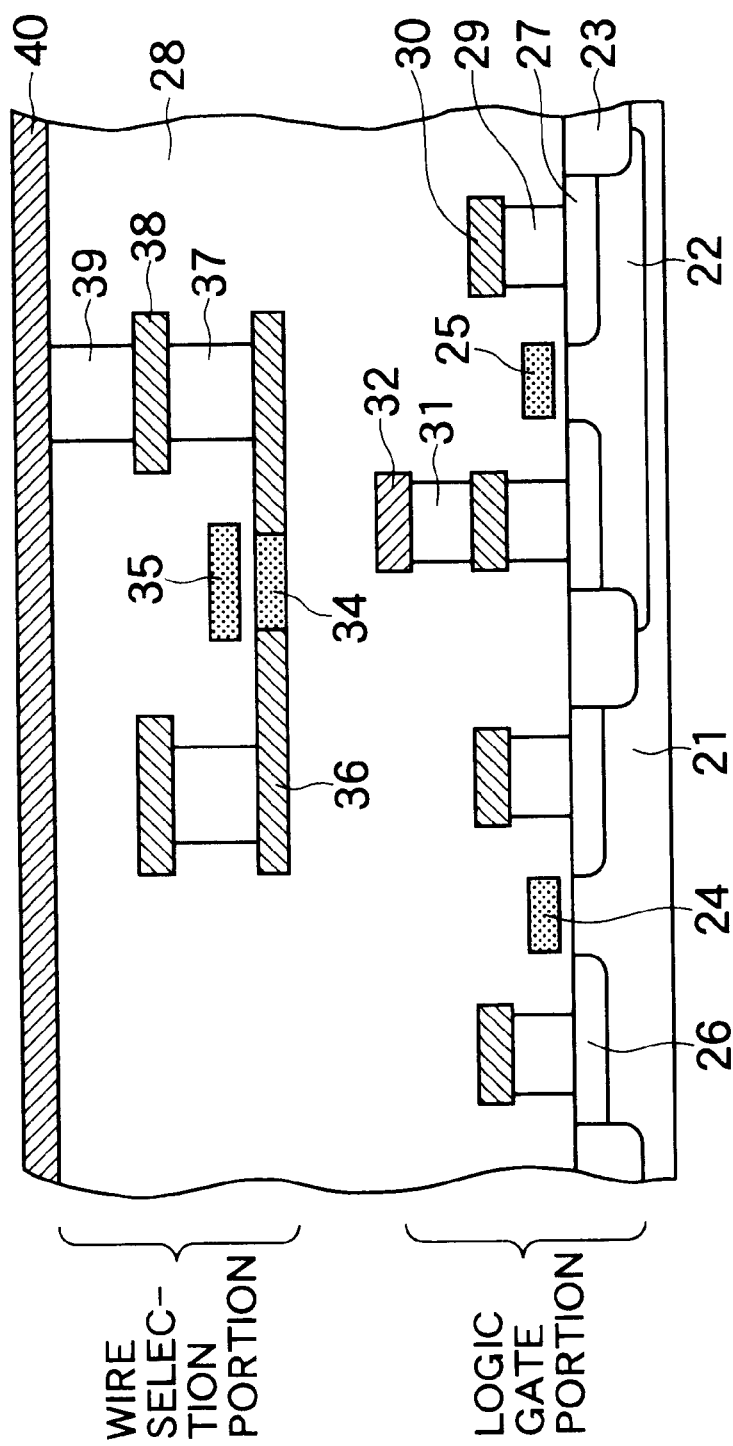
FIG. 7 is a cross sectional view of a first embodiment.

Referring to FIG. 7, the transfer gate is inserted between a third layer wiring pattern and a fourth layer wiring pattern.

As illustrated in FIG. 7, an n-type well 22 and a device isolation oxide film 23 are formed on a surface region of a p-type silicon substrate 21. An n-channel MOS transistor having a gate electrode 24 and an n-type diffusion layers 26 is placed on the surface of the p-type silicon substrate 21. While, a p-channel MOS transistor having a gate electrode 25 and a p-type diffusion layers 27 is provided on the surface of the n-type well 22.

Further, an interlayer insulating film 28 is placed on the substrate. A first layer, a second layer, and a third layer wiring patterns 30, 32, 38 are formed in the interlayer insulating film 28, and a fourth layer wiring pattern 40 are formed on the interlayer insulating film 28.

Moreover, an n-channel enhancement type TFT is placed between the second layer wiring pattern 32 and the third layer wiring pattern 38. Herein, the n-channel enhancement type TFT has a p-type polysilicon film 34 serving as a channel region and an n-type polysilicon film 36 serving as source/drain regions.

In addition, first, second, fourth, and fifth conductive plugs are positioned between the diffusion layer and the wiring layer and between the wiring layers so as to connect them to each other.

Referring to FIGS. 8 and 9, description will be made about a method of manufacturing a semiconductor integrated circuit according to this invention. Herein, the transfer gate according to the first embodiment is connected between the second layer wiring pattern and the third layer wiring pattern.

Figure 8A:
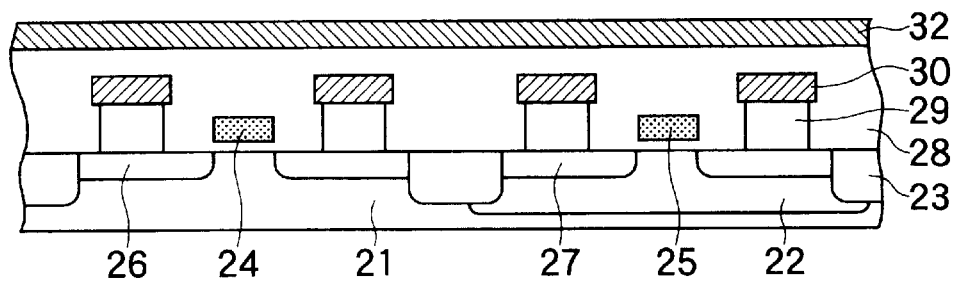
FIGS. 8A to 8C are cross sectional views showing a manufacturing method of a first embodiment according to this invention.

First, the n-channel and p-channel MOS transistors are formed on the p-type silicon substrate 21, as illustrated in FIG. 8A. Further, the first layer wiring pattern 30 is formed via the first conductive plug 29, and the second layer wiring pattern 32 is formed via the interlayer insulating film.

In this event, the first and second layer wiring patterns are formed by the use of a high-melting point metal, such as, tungsten (W) to resist a high temperature process.

Figure 8B:
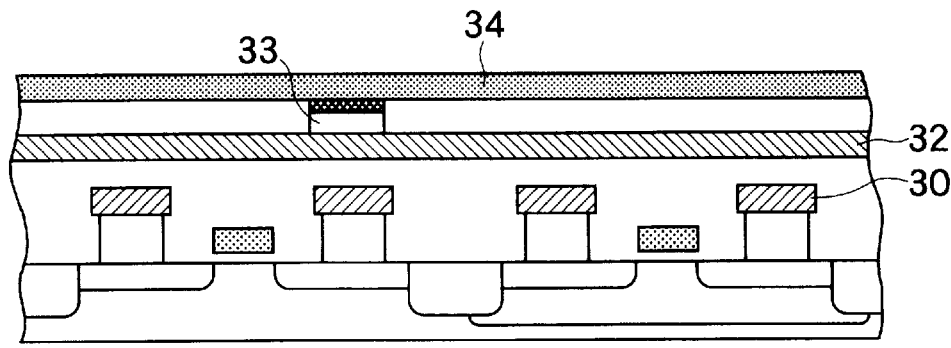

Subsequently, the interlayer insulating film is deposited in the second layer wiring pattern 32, as illustrated in FIG. 8B. After a via-hole is formed in the interlayer insulating film, the third conductive plug 33 consisting of W and TiN is formed so as to cover the surface thereof. Herein, the surface is covered with TiN to prevent W from becoming a silicide.

Further, the p-type polysilicon film 34 is deposited on the entire surface of the interlayer insulating film. In this case, the p-type polysilicon film may be doped with boron during the deposition, and alternatively, may be doped with boron by the use of the known ion implantation method after depositing non-doped polysilicon. Thereafter, crystallinity of the polysilicon is enhanced by performing a thermal process of about 700° C.

Figure 8C:
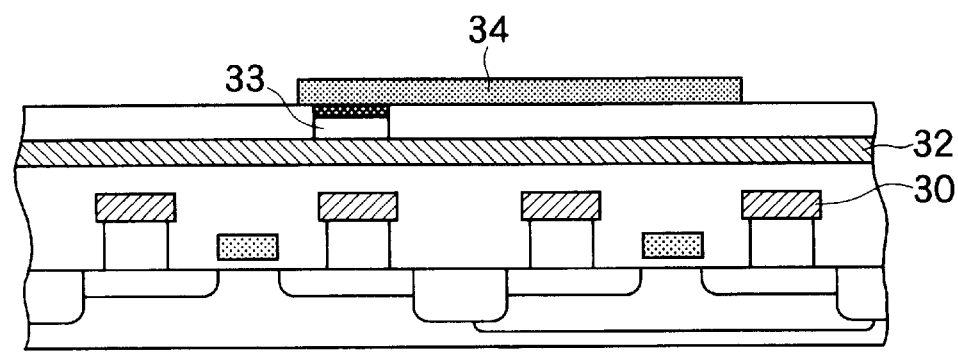

Next, the p-type polysilicon film 34 is patterned such that an island-like region is left on a TFT formation region, as illustrated in FIG. 8C.

Figure 9A:
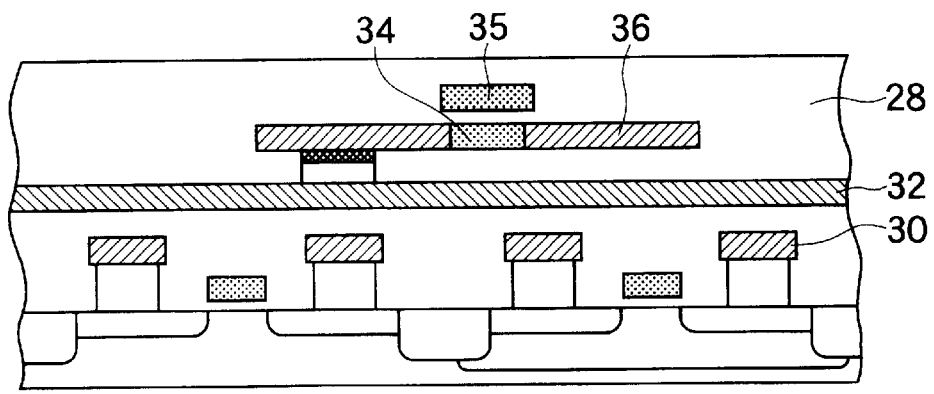
FIGS. 9A to 9C are cross sectional views showing a manufacturing method of a first embodiment according to this invention.

Successively, the surface of the p-type polysilicon film 34 is oxidized to form a silicon oxide film serving as a gate insulating film, as illustrated in FIG. 9A. Thereafter, the polysilicon is deposited thereon, and is patterned to form a gate electrode 35.

Subsequently, phosphorous (P) ions are implanted by using the gate electrode 35 as a mask, and the implanted ions are activated by performing a thermal process of 600° C. to form the n-type polysilicon film 36.

Herein, the gate insulating film 35 may be a silicon oxide film or a silicon nitride film formed by the CVD method. Thereafter, the interlayer insulating film 28 is deposited on the entire surface.

Figure 9B:
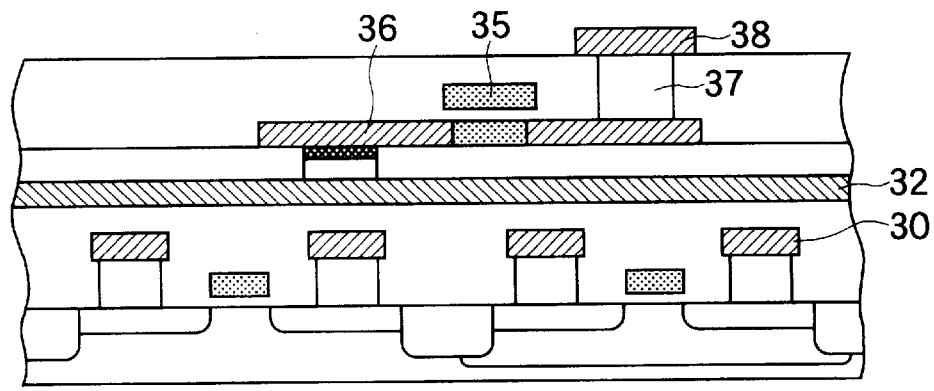
Figure 10:
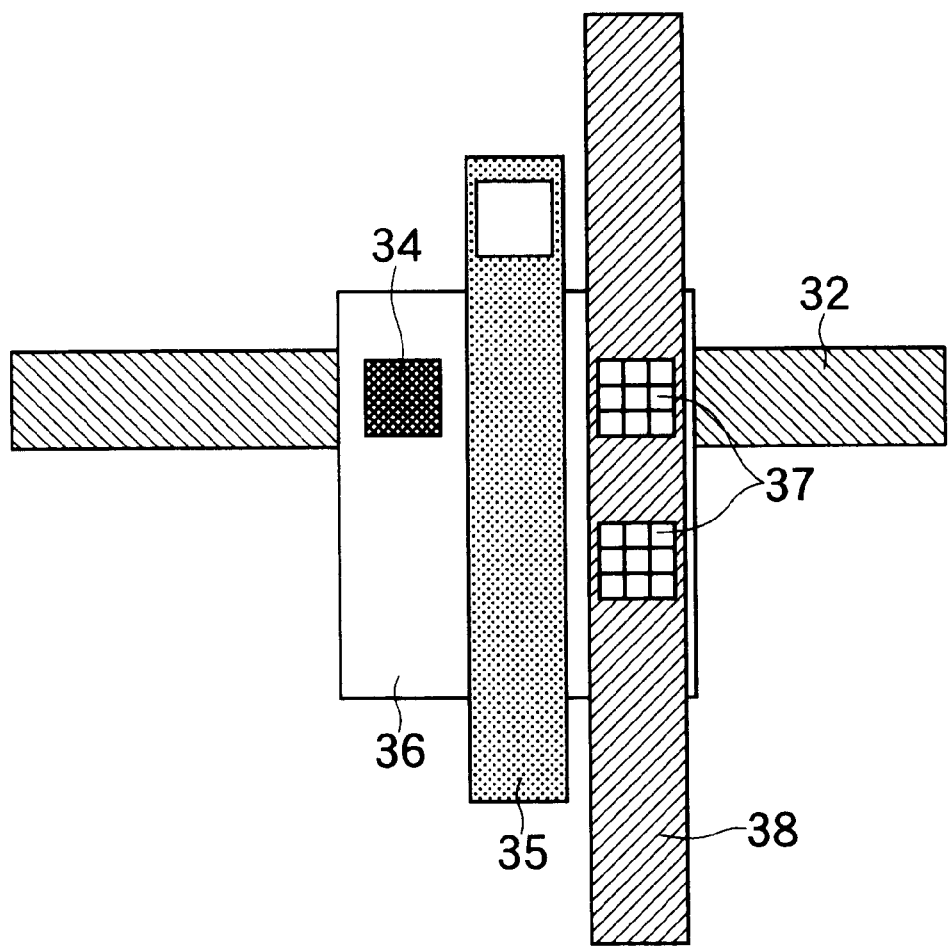
FIG. 10 is a partial plan view showing a manufacturing method of a first embodiment according to this invention.

Next, a via-hole is opened in the interlayer insulating film 28 so as to reach the n-type diffusion layer 36, and the fourth conductive plug 37 is formed, as illustrated in FIG. 9B. Thereafter, the third layer wiring pattern consisting of Al is formed thereon. Herein, a layout in this state is illustrated in FIG. 10.

Figure 9C:
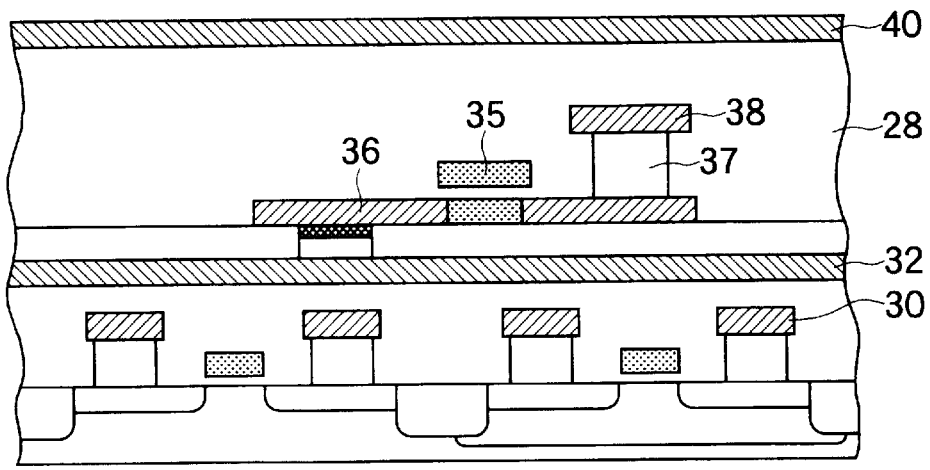

Thereafter, the interlayer insulating film is deposited as illustrated in FIG. 9C, and the fourth layer wiring pattern 40 consisting of Al is formed. Thus, the manufacturing process according to this embodiment is completed.

Referring to FIGS. 11 and 12, description will be made about the other manufacturing method according to the first embodiment.

Figure 11A:
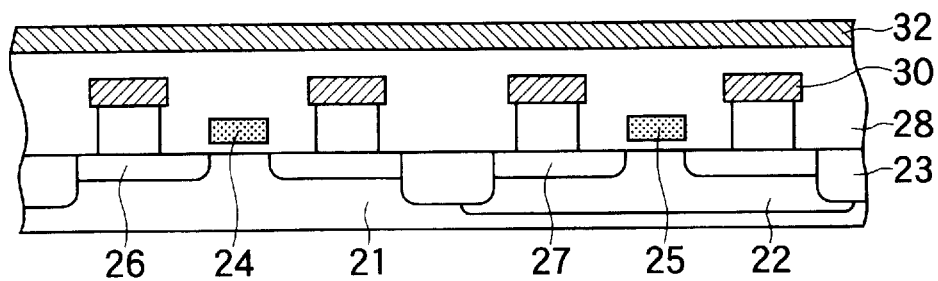
FIGS. 11A to 11C is a cross sectional view showing the other manufacturing method of a first embodiment according to this invention.

First, the CMOS device and the first and second layer wiring patterns are formed on the p-type silicon substrate by the use of the known general process, as illustrated in FIG. 11A.

Figure 11B:
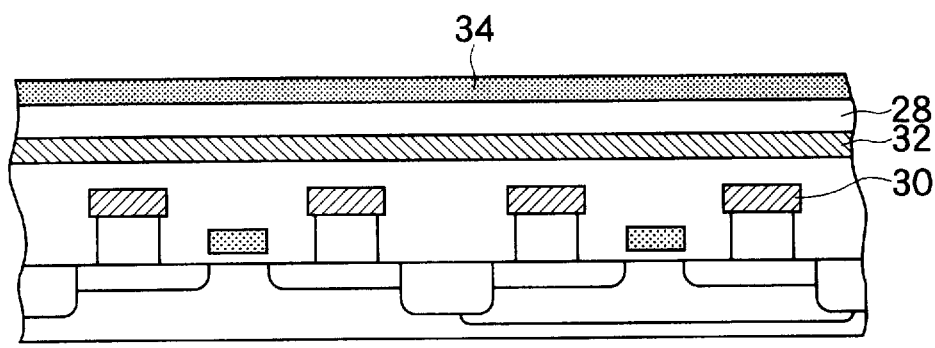

Subsequently, the interlayer insulating film 28 and the p-type polysilicon film 34 are deposited by the use of the CVD method, and the crystallinity of the polysilicon film is enhanced by performing a thermal process of about 700° C., as illustrated in FIG. 11B.

Figure 11C:
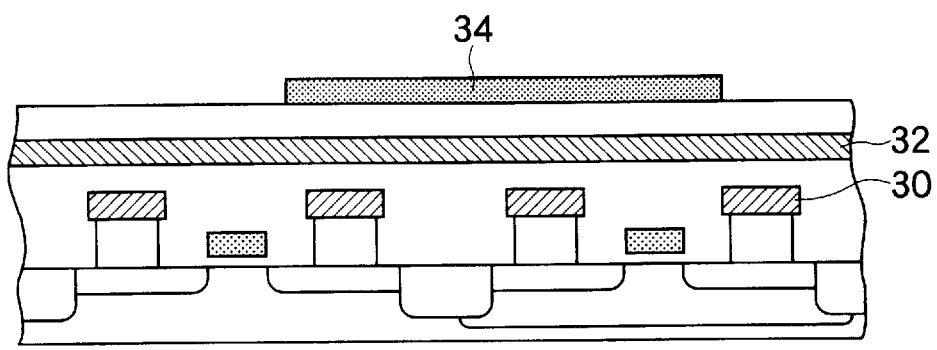

Successively, the p-type polysilicon film 34 is patterned such that an island-like region is left on the TFT formation region, as illustrated in FIG. 11C.

Figure 12A:
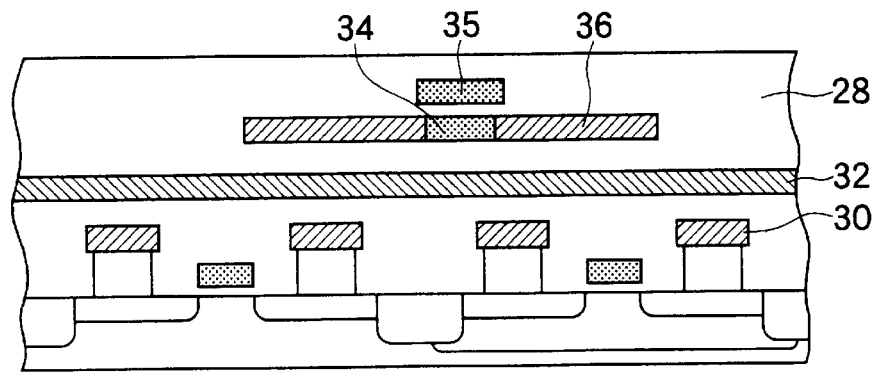
FIGS. 12A to 12C are cross sectional views showing the other manufacturing method of a first embodiment according to this invention.

Next, the gate electrode 35 is formed on the p-type polysilicon film 34, as illustrated in FIG. 12A. Further, phosphorous (P) ions are implanted by using the gate electrode 35 as a mask, and the implanted ions are activated by performing a thermal process of 600° C. to form the n-type polysilicon film 36. Thereafter, the interlayer insulating film 28 is deposited on the entire surface.

Figure 12B:
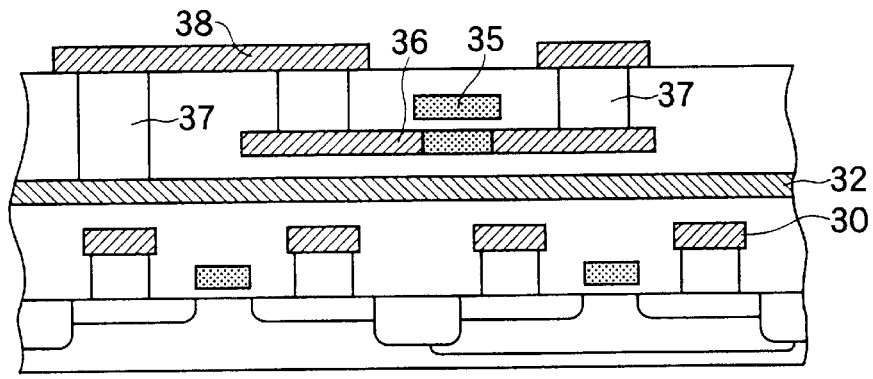

Subsequently, the via-hole is opened in the interlayer insulating film 28 so as to reach the second layer wiring pattern 32 and the n-type polysilicon film 36, and the fourth conductive plug 37 is formed thereon, as illustrated in FIG. 12B.

Figure 13:
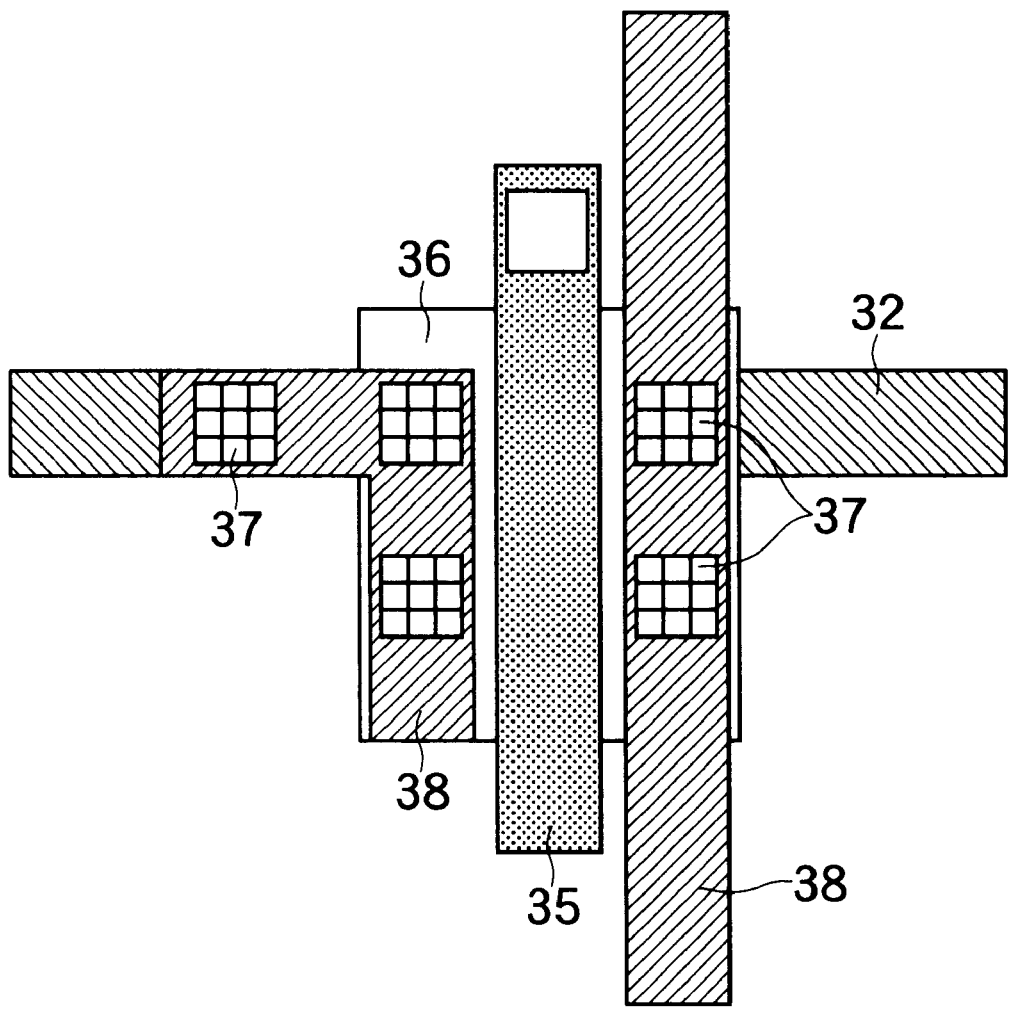
FIG. 13 is a partial plan view showing a manufacturing method of a first embodiment according to this invention.

Thereafter, the third layer wiring pattern 38 consisting of Al is formed on the interlayer insulating film 28. Herein, a layout in this state is illustrated in FIG. 13.

Figure 12C:
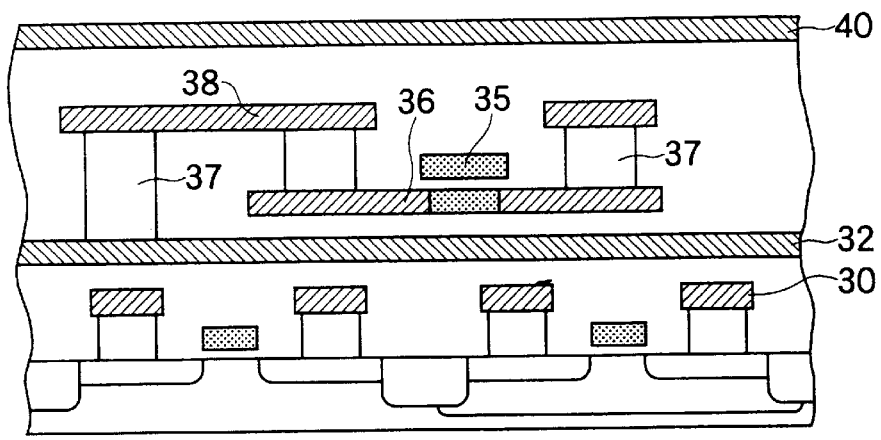

Next, the interlayer insulating film is deposited thereon, and the fourth layer wiring pattern 40 is formed thereon, as illustrated in FIG. 12C. Thus, the manufacturing process according to this embodiment is completed.

(Second embodiment)

Figure 14A:
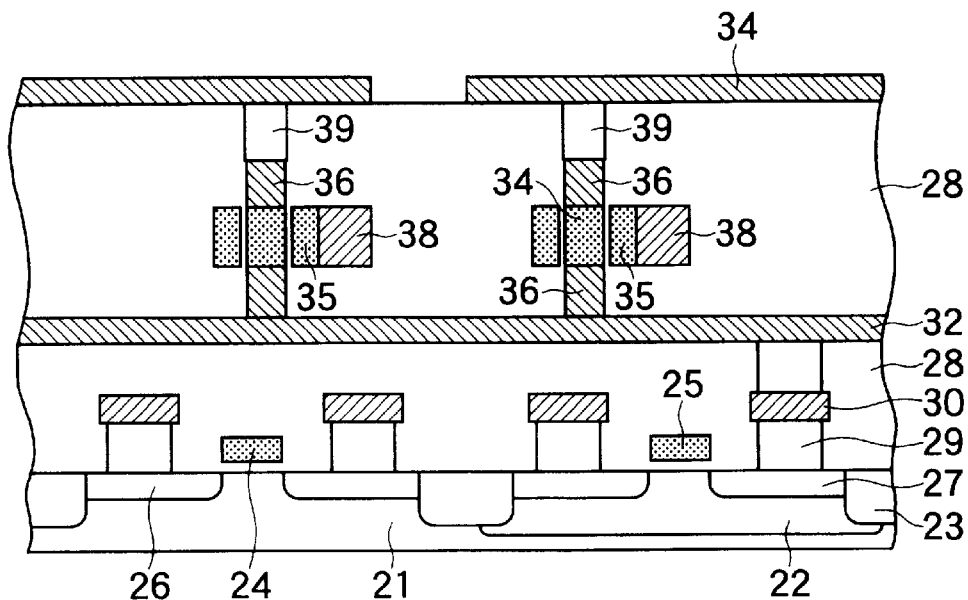
FIG. 14A is a cross sectional view of a second embodiment according to this invention.
Figure 14B:
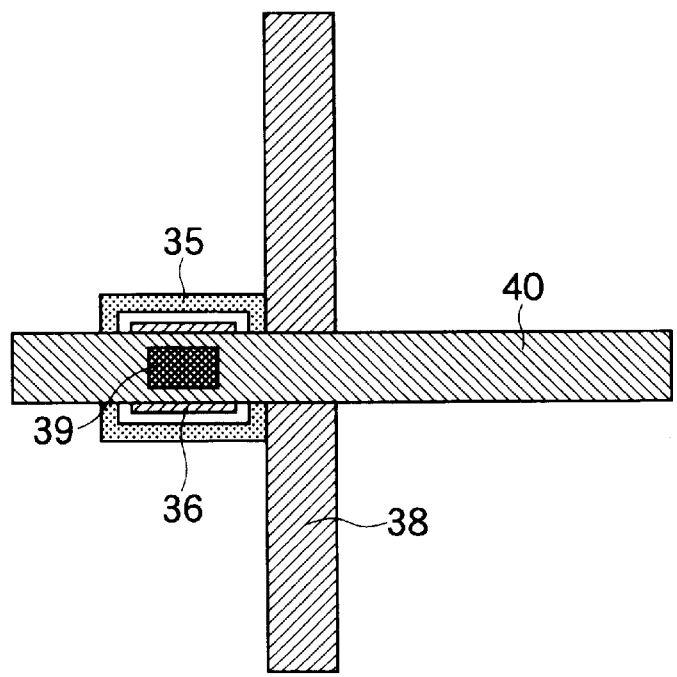
FIG. 14B is a layout diagram of a second embodiment according to this invention.

Referring to FIG. 14, description will be made about a second embodiment of this invention. Herein, it is to be noted that a basic circuit structure is substantially equivalent to the first embodiment illustrated in FIGS. 4 through 6.

A vertical type thin-film transistor is used, in which a channel is formed in a vertical direction, is used a MOS transistor in this embodiment.

In FIG. 14, the transfer gate is inserted between the second layer wiring pattern 32 and the fourth layer wiring pattern 40 in the basis cell according to this embodiment.

Herein, the same reference numbers are attached for the portions corresponding to the portions of the first embodiment illustrated in FIG. 7. Therefore, the explanation with respect to the corresponding portions will be omitted hereinafter.

An n-type polysilicon films 36 serving as source/drain regions and a p-type polysilicon film 34 servings as a channel are laminated between the second layer wiring pattern 32 and the fourth layer wiring pattern 40 via the fifth conductive plug 39.

Further, a gate electrode 35 consisting of an n-type polysilicon film is formed at the peripheral portion of the p-type polysilicon film 34. A third layer wiring pattern 38 serving as a gate wiring pattern is connected to the gate electrode 35.

Referring to FIGS. 15 and 16, description will be made about a method for manufacturing the semiconductor integrated circuit according the second embodiment.

Figure 15A:
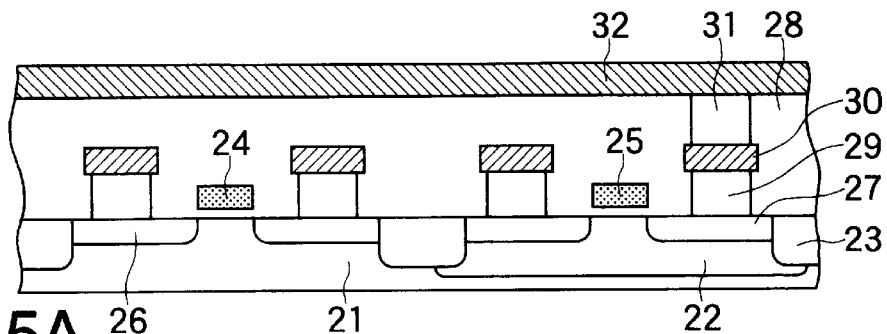
FIGS. 15A to 15D are cross sectional views showing a manufacturing method of a second embodiment according to this invention.

First, the n-channel and p-channel MOS transistors are formed on the p-type silicon substrate 21, as illustrated in FIG. 15A. Further, the second layer wiring pattern 32 of formed via the second conductive plug 31.

In this event, the first and second layer wiring patterns are formed by the use of the high-melting point metal, such as, the tungsten (W) so as to resist the subsequent high temperature process.

Figure 15B:
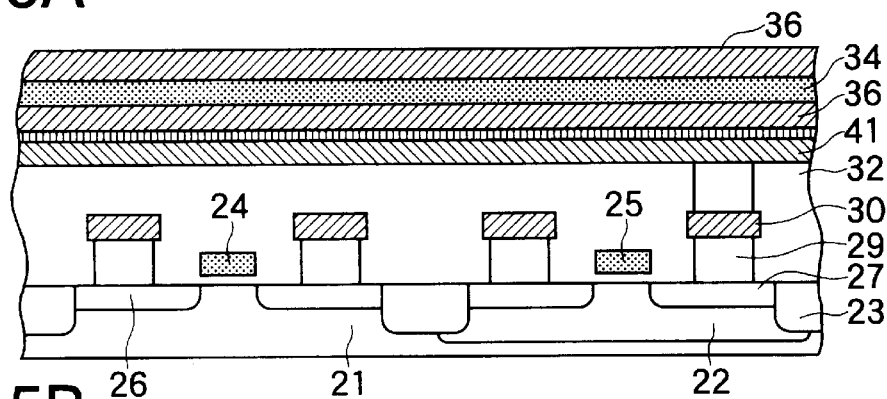

Subsequently, the TiN film is deposited on the second layer wiring pattern 32 as a barrier metal layer 41, as illustrated in FIG. 15B. Further, an n-type polysilicon film 36, a p-type polysilicon film 34, and an n-type polysilicon film 36 are sequentially deposited thereon by the CVD method.

Herein, impurity is preferably doped to the polysilicon film in situ. Alternatively, the impurity may be doped by the use of the known ion implanting method.

Figure 15C:
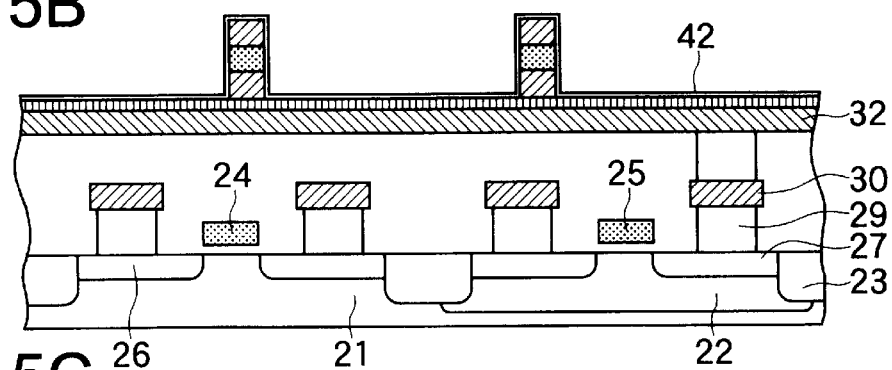
Figure 15D:
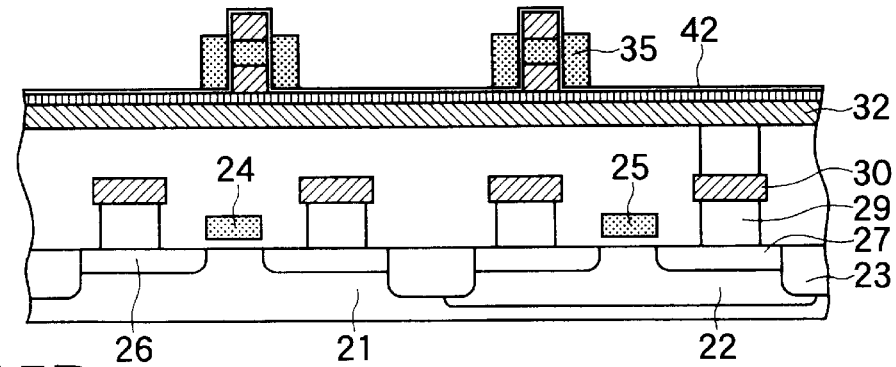

Next, after the polysilicon film is patterned by the photolithography, the silicon oxide film 42 serving as the gate insulating film is deposited by the CVD method, as illustrated in FIG. 15C. In this event, the silicon oxide film 42 may be deposited by the use of the thermal oxidation method.

Successively, the gate electrode 35 is formed to an annular shape by deposition of the n-type polysilicon and etch-back thereof.

Figure 16A:
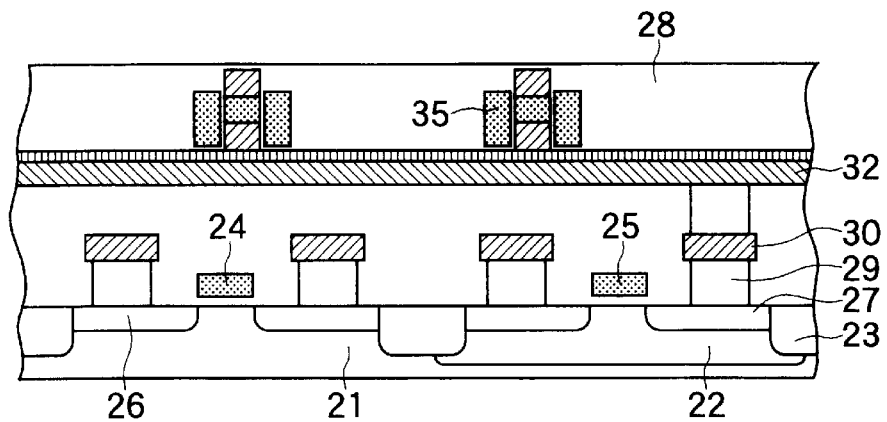
FIGS. 16A to 16C are cross sectional views showing a manufacturing method of a second embodiment according to this invention.

Subsequently, the interlayer insulating film 28 is deposited by the CVD method, and the surface is flattened by the use of CMP (chemical mechanical polishing), as illustrated in FIG. 16A. Successively, a wiring groove is formed to expose the side surface of the gate electrode 35.

Figure 16B:
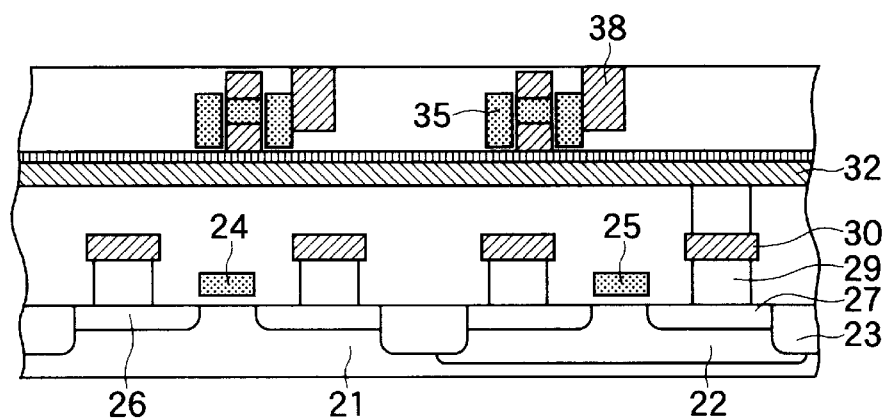

Further, the third layer wiring pattern 38 serving as the gate wiring pattern is formed in the wiring groove by the use of the deposition of the metal film and the CMP, as illustrated in FIG. 16B.

Thereafter, another interlayer insulating film is deposited, and a contact hole is opened therein to expose the surface of the n-type polysilicon film 36 which will become the drain region.

Figure 16C:
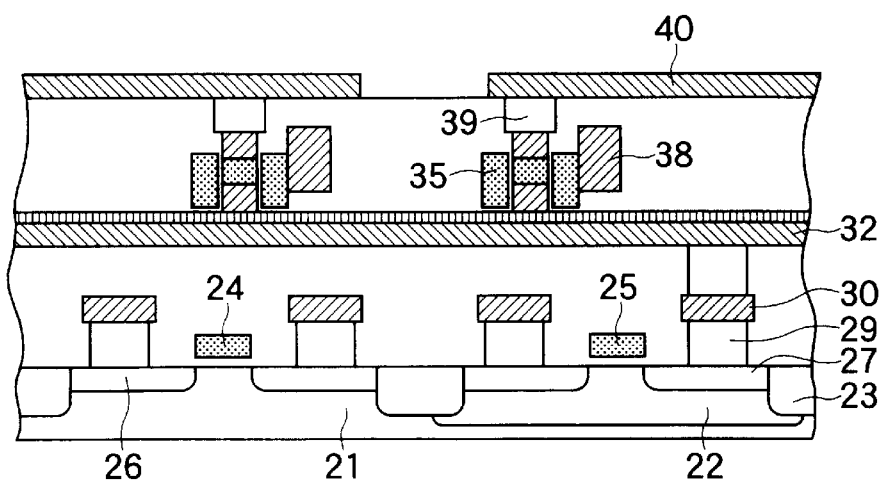

Further, the fifth conductive plug is buried in the contact hole. Next, the fourth layer wiring pattern 40 is formed thereon by the deposition of the metal film and the patterning, as illustrated in FIG. 16C.

Figure 17A:
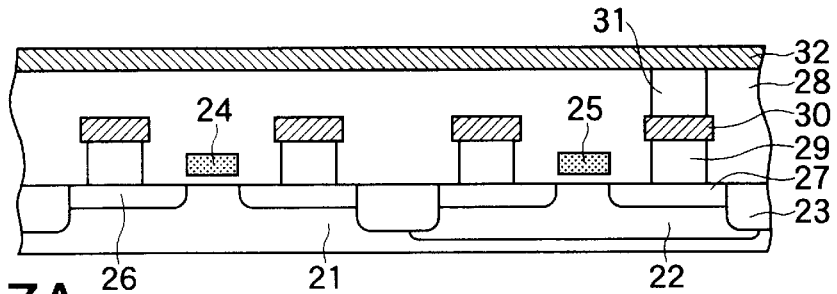
FIGS. 17A to 17D are cross sectional views showing the other manufacturing method of a second embodiment according to this invention.
Figure 17B:
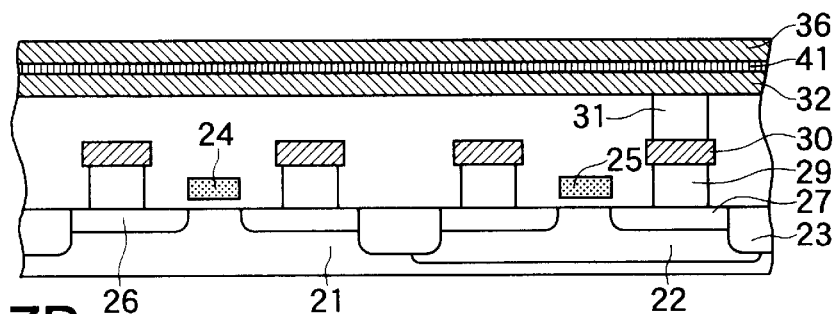
Figure 17C:
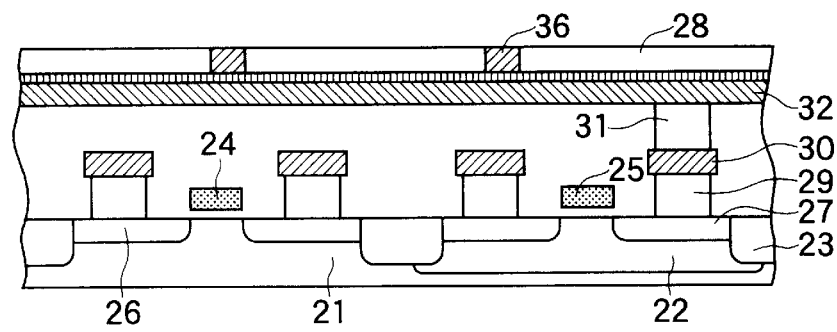
Figure 17D:
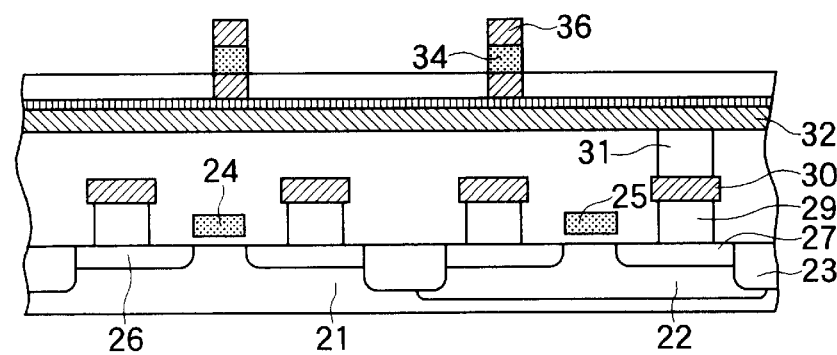
Figure 18A:
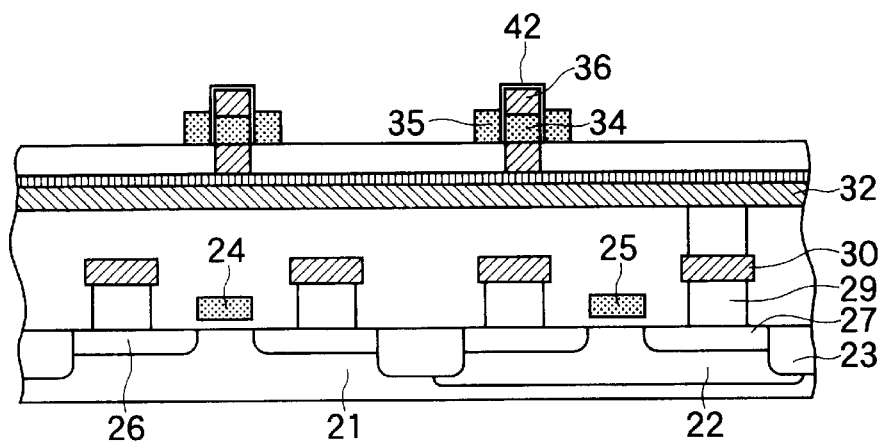
FIGS. 18A to 18C are cross sectional views showing the other manufacturing method of a second embodiment according to this invention.
Figure 18B:
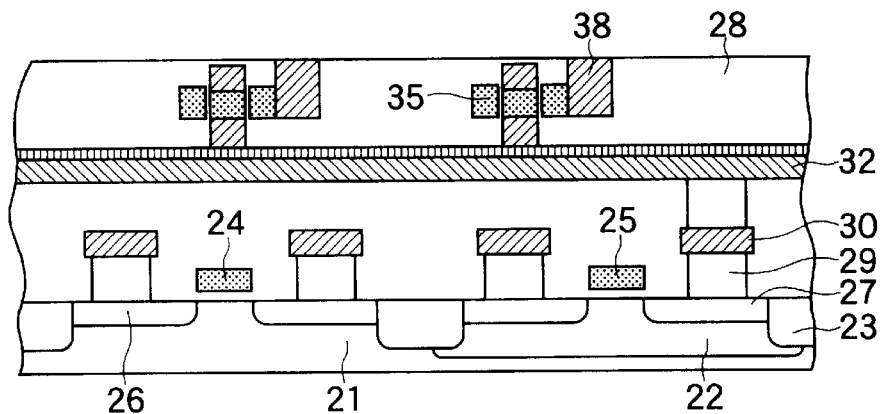
Figure 18C:
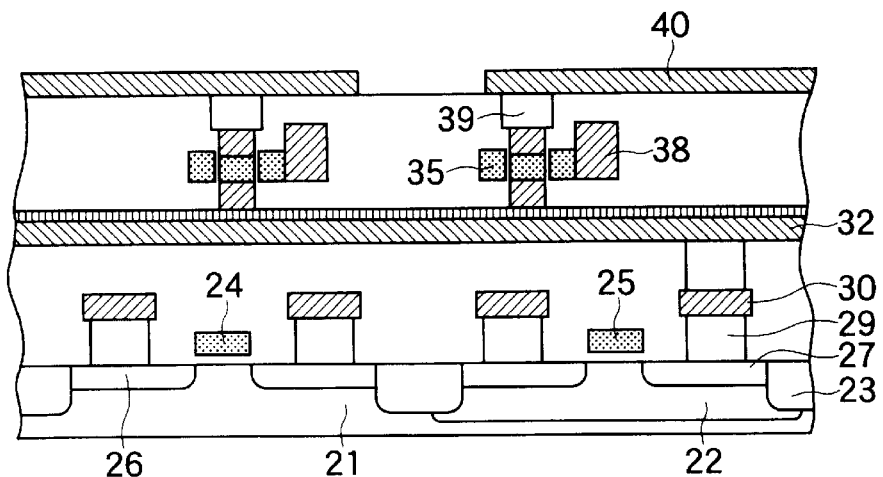

Referring to FIGS. 17 and 18, description will be made about the other manufacturing method according to the second embodiment.

First, the n-channel and p-channel MOS transistors are formed on the p-type silicon substrate 21, as illustrated in FIG. 17A. Further, the first layer wiring pattern 30 is formed via the first conductive plug 29, and the second layer wiring pattern 32 is formed via the second conductive plug 31.

Subsequently, the TiN film is deposited as the barrier metal layer 41 on the second layer wiring pattern 32 so as to prevent reaction with the polysilicon film, as illustrated in FIG. 17B.

Further, the polysilicon is deposited thereon by the low-pressure CVD method, and the n-type polysilicon film 36 is deposited by doping an n-type impurity with high concentration by the ion implanting method.

Subsequently, after the n-type polysilicon film 36 is patterned as illustrated in FIG. 17C, the interlayer insulating film is deposited thereon, and the surface is flattened by the CMP to expose the surface of the n-type polysilicon film 36.

Next, the p-type polysilicon and the non-doped polysilicon are successively deposited, as illustrated in FIG. 17D. Further, the n-type impurity ions are implanted with high concentration to form laminate the p-type polysilicon film 34 and the n-type polysilicon film 36. Thereafter, the laminated film is patterned by the use of the photolithography method.

Subsequently, the silicon oxide film 42 serving as the gate insulating film of the polysilicon film 34, 36 is deposited by the use of a thermal oxidation, as illustrated in FIG. 18A.

Thereafter, the annular gate electrode 35 is formed at the side surface of the p-type silicon film 34 serving as the channel region by the deposition of the n-type polysilicon and the etchback thereof.

Successively, the interlayer insulating film 28 is deposited by the CVD method. After the surface is flattened by the CMP, the wiring groove is formed so as to expose the side surface of the gate electrode 35. Further, the third layer wiring pattern 38 serving as the gate wiring pattern is formed in the wiring groove, as illustrated in FIG. 18B.

Next, another interlayer insulating film is deposited, and the contact hole is opened so as to expose the surface of the n-type polysilicon film 36 serving as the drain region. The fifth conductive plug 39 is buried in the contact hole.

Subsequently, the fourth layer wiring pattern 40 is formed by the deposition of the metal film and the patterning thereof.

Although the thin-film transistor is inserted between the second layer wiring pattern and the fourth layer wiring pattern in the second embodiment, the transistor may be formed between the other wiring layers, for example, between the second layer wiring pattern and the third layer wiring pattern.

In this case, any one of the first through fourth layer wiring patterns may be used as the gate wiring pattern for extracting the gate electrode. Alternatively, the gate wiring pattern may be formed by an additional wiring layer.

(Third embodiment)

Figure 19:
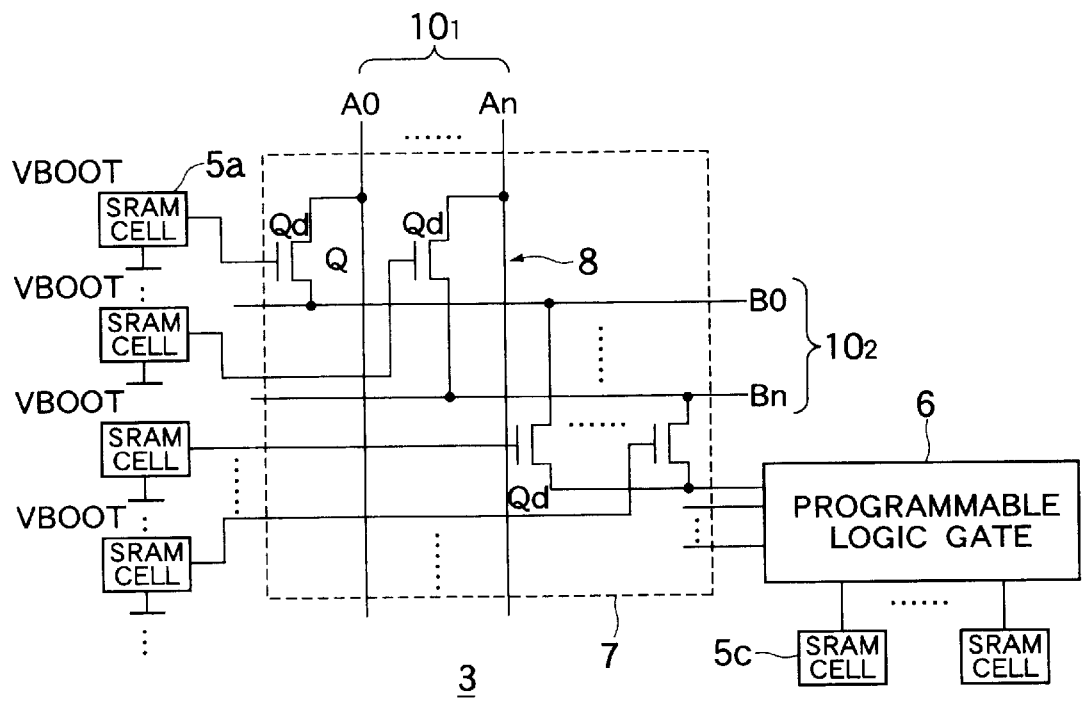
FIG. 19 is a partial circuit diagram of a third embodiment.

Referring to FIG. 19, description will be made about a third embodiment of this invention.

In this embodiment, the transfer gate in the switching portion (not shown) of the wiring selection portion 7 and the logic gate portion is structured by an n-channel depletion type TFT Qd.

In this event, a threshold voltage of the TFT becomes a negative value. To this end, logic amplitude of a signal from a SRAM cell 5c is set to VCC-VNEG to turn off the transistor. This VNEG is a potential for sufficiently turning off the transistor. The VNEG may be produced in an internal portion, and alternatively, may be given from an external portion.

Figure 20:
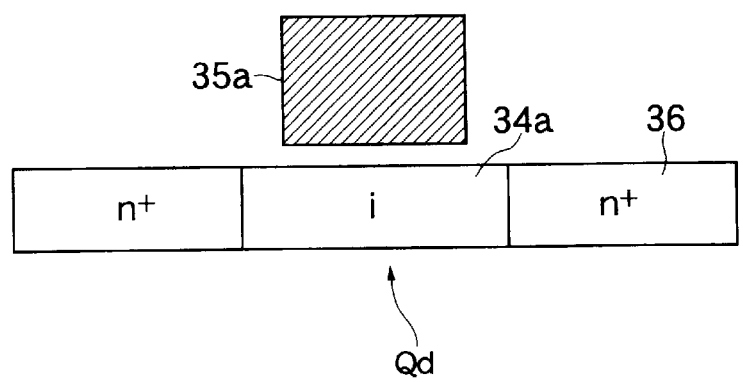
FIG. 20 is a cross sectional view of a TFT used in a third embodiment.

In the transistor illustrated in FIG. 20, the channel region under the n-type polysilicon gate 35a is formed by the non-doped polysilicon film 34a. In the case of the n-channel enhancement type TFT in the first embodiment illustrated in FIG. 5, the channel region is a p-type while the gate electrode is also a p-type. Consequently, the process becomes complex, and carrier mobility is sacrificed, namely may be reduced.

In the transistor according to the third embodiment, the channel region becomes the non-doped polysilicon. In consequence, the carrier mobility becomes high, and a driving ability of the transistor is enhanced.

Further, the source/drain regions of the transistor can be formed by the n-type polysilicon film 36 while the gate electrode 35a can be formed by the n-type polysilicon film. Thereby, the process can be largely simplified.

Moreover, the vertical type thin-film transistor illustrated in FIG. 14 can be formed as the depletion type.

(Fourth embodiment)

Figure 21A:
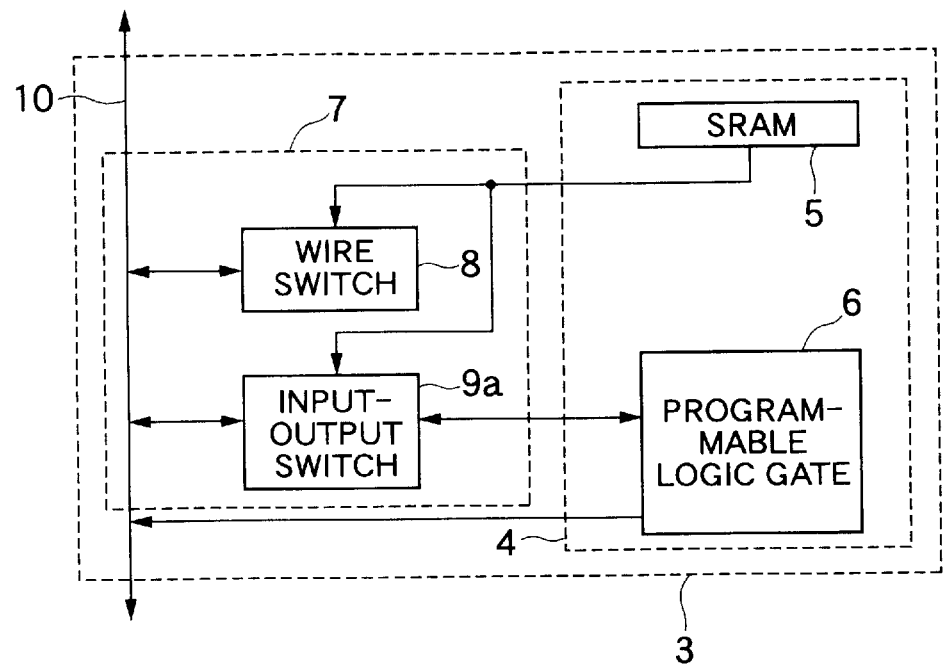
FIGS. 21A and 21B are block diagrams of a basic cell in a fourth embodiment.

Referring to FIG. 21A, description will be made about a fourth embodiment of this invention.

In this embodiment, the logic gate in the basic cell 2 is a fixed logic gate 6a, and the output of the logic gate directly drives the wiring pattern of the signal bus between the basic cells without using the input-output switch.

Even when the channel region of the TFT is formed by the use of the non-doped polysilicon as in the third embodiment, the threshold value is varied in dependence upon the thickness of the polysilicon film. When the load is large, variation of the threshold value appears as variation of signal delay.

To solve this problem, the input-output switch in the wiring selection portion 7 is replaced by an input switch 9a. Under this circumstance, programming for the logic gate is performed for only the input signal, and the output signal is directly outputted to the signal bus 10 via the output buffer of the fixed logic gate 6a formed on the substrate.

Figure 21B:
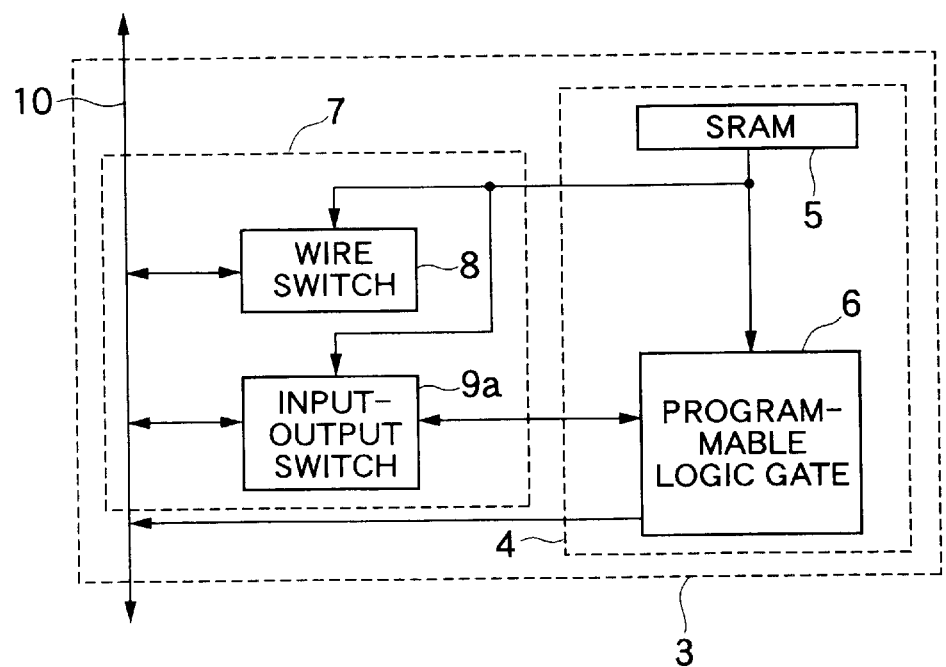

Referring to FIG. 21B, a programmable logic gate 6 is used instead of the fix logic gate 6a. In this event, the transfer gate of the programmable logic gate 6 may be structured by a bulk type MOS transistor, and alternatively, may be formed by the TFT.

(Fifth embodiment)

Figure 22:
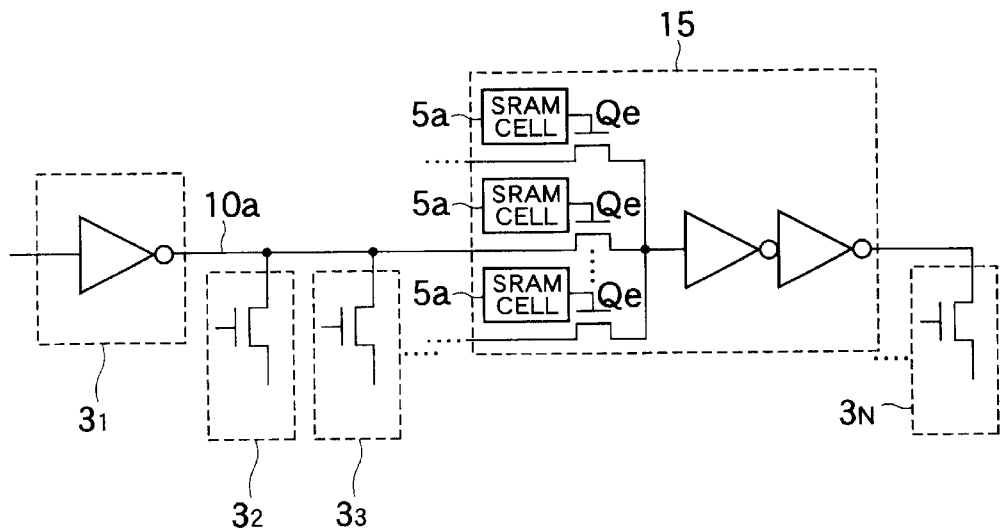
FIG. 22 is a characteristic part of a circuit diagram of a fifth embodiment.

Referring to FIG. 22, description will be made about a fifth embodiment of this invention.

In this embodiment, the output of the logic gate will drive further heavy load in comparison with the fourth embodiment.

Under such a circumstance, the output buffer of the logic gate is directly coupled to the signal bus, as in the fourth embodiment. Further, a repeater is preferably arranged in the course of the signal bus.

In this embodiment, the repeater serves to select one bus among a plurality of buses. More specifically, the output buffer of the fixed logic gate in the basic cell $3_1$ having the structure illustrated in FIG. 21A directly drives a logic gate group common signal bus 10a. Input circuits of basic cells $3_2$, $3_3$ . . . within a close distance are connected to the common signal bus 10a.

Further, the logic gate group common bus 10a is coupled to the bus selection circuit and repeater 15 with the other common signal bus. Moreover, the signal of the common signal bus 10a selected by the SRAM cell 5a is given to the basic cells . . . , 3N within a far distance. In this case, the common signal bus 10a is preferably selected at an input side of the repeater, as illustrated in FIG. 22.

In this embodiment, the logic gate is fixed, and a desired logic is realized by only the input switch. Herein, it is to be noted that the programming due to only the input switch was not carried out in the conventional case. This is because it has disadvantage in area in the cause of many switches, and the number of the switches attached to one signal bus is increased.

However, the area will not become large because of the three-dimensional form. Further, an increase of parasitic capacitance of the signal line is suppressed by adopting the TFT.

Consequently, both the area and the wiring load are not increased. Herein, the parasitic capacitance is generated when the switch is attached to the bus.

Figure 23:
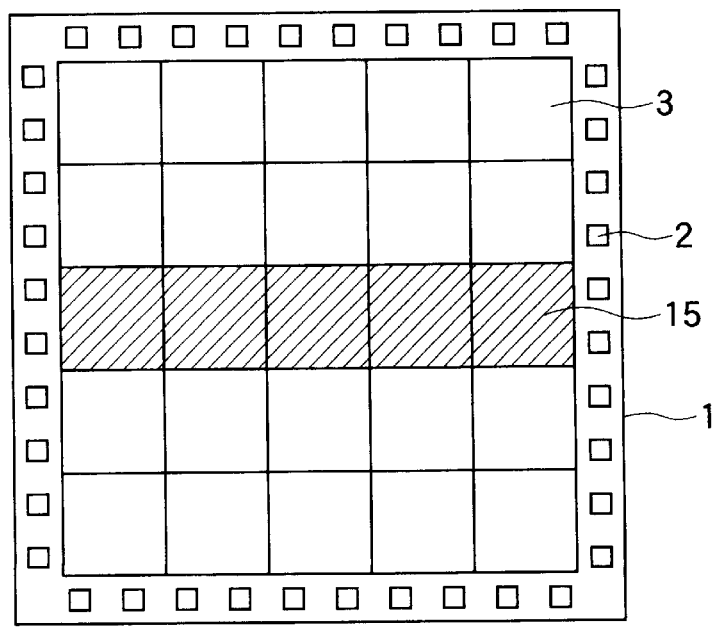
FIG. 23 is a layout diagram of a fifth embodiment.

Referring to FIG. 23, the bus selection circuit and repeater 15 as the basic cell is arranged between groups of the other basic cells 3 in this embodiment.

In such a cell, the repeater itself and the SRAM cell are formed on the surface of the semiconductor substrate, and the TFT serving as the transfer gate is formed thereon.

In this embodiment, the bus selection circuit and repeater 15 is inserted between the basic cells 3, and thereby, the area is sacrificed. In the meantime, the delay variation of the signal will not occur. In consequence, a high-speed programmable device can be produced.

Further, the signal from the SRAM is given to only the wire selection portion in the basic cell 3 in this embodiment. Consequently, it is easy to flexibly arrange the wiring pattern from the SRAM. Further, the SRAM can be freely arranged. To this end, it is possible to commonly use the SRAM between the basic cells.

(Sixth embodiment)

Figure 24:
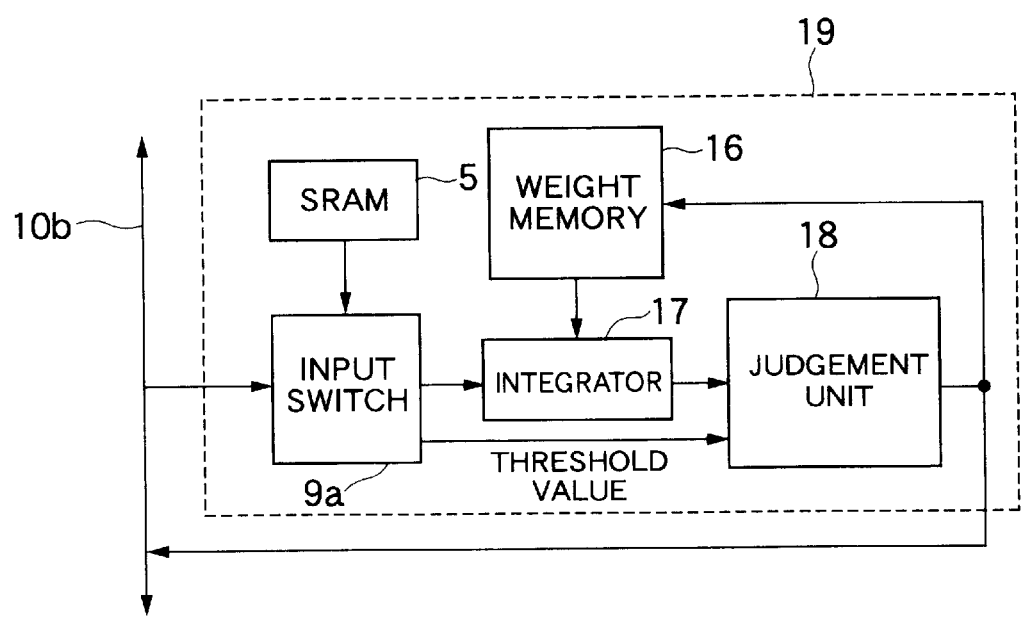
FIG. 24 is a block diagram of a basic cell of a sixth embodiment.

Referring to FIG. 24, description will be made about a sixth embodiment of this invention.

Although this invention is adapted to the programmable device in the above-mentioned respective embodiments, this invention is applicable for a digital neuron. The neuron 19 is composed of a weight memory 16, an integrator 17, a judgement unit 18, an SRAM 5, and an input switch 9a, as illustrated in FIG. 24.

In this event, the weight memory 16 and the integrator 17 constitute a logic gate portion while a portion corresponding to a synapse combination portion becomes an input switch portion.

A signal is given to the integrator 17 via the input switch 9a by a common bus 10b between neurons. After the signal is weighted on the basis of the storing content of the weight memory 16, the integration is carried out.

The judgement unit 18 compares the calculation result of the integrator 17 with the threshold value given via the input switch 9a, and produces a judgement signal. The judgement signal is given to the common signal bus 10b, and is fed-back to the weight memory 16 in order to change the storing data in the weight memory 16.

In such a digital neuron device, a total combination type has higher versatility, and the programming can be readily carried out. Herein, the neurons are totally connected by wiring patterns in the total combination type. In this case, the wiring patterns are congested to totally connect the wiring patterns, and as a result, a chip area is increased.

However, the switch is arranged between the wiring patterns in this invention. Thereby, the congestion of the wiring patterns is relieved, and the wiring layer of the synapse can be formed. In this event, it is actually impossible to store all weight of the synapse of the total combination in the weight memory 16. Consequently, the switch portion is used so as to select the synapse for storing the weight.

Thus, this invention is applicable for any LSI having a plurality of switches in addition to the programmable device. Further, this invention will be applicable for a LSI, which does not have a plurality of transfer gates, by changing the logic.

While this invention has thus far been disclosed in conjunction with several embodiments thereof, it will be readily possible for those skilled in the art to put this invention into practice in various other manners.

In the above-mentioned embodiments, the transfer gate is structured by the TFT. Alternatively, an SOI structure may be formed on the silicon substrate to form the transfer gate thereon.

Further, the TFT may be formed by dividing to layers of two or more.

Moreover, although the SRAM cells are separately arranged in the above-mentioned embodiments, the SRAM cells may be collectively arranged.

Further, the SRAM may be replaced by a DRAM, a ROM, an EPROM, and an EEPROM (including a flash memory).

In addition, the thermal process for improving the crystallinity of the polysilicon film serving as the active layer of the TFT can be carried out by irradiating a laser beam. In this case, the wiring layer as the underlayer of the TFT may be formed by Al based material.

What is claimed is:

1. A semiconductor integrated circuit having a plurality of basic cells which are placed in a matrix form and are connected to each other via a signal bus, wherein:

each of the basic cells includes a wire selection portion and a logic gate portion, the wire selection portion having at least one thin film transistor placed in an interlayer insulating film over a semiconductor substrate, the logic gate portion has a programmable logic gate and a memory for programming the programmable logic gate, the wire selection portion has a wire switch and an input-output switch, the wire switch is connected to the signal bus and the memory, and the input-output switch is connected to the signal bus, the memory and the programmable logic gate, each of the wire switch and input-output switch being controlled by a data signal stored in the memory.

2. A circuit as claimed in claim 1, wherein:

the data signal is written into the memory by the use of one of a ROM, an EPROM, and an EEPROM when a power supply is introduced.

3. A circuit as claimed in claim 1, wherein:

the memory comprises an SRAM, a DRAM, a ROM, an EPROM, and an EEPROM.

4. A circuit as claimed in claim 1, wherein:

the signal bus comprises a Y-direction signal bus having first wiring lines and a X-direction signal bus having second wiring lines, the wire switch has first transfer gates which are placed between the first wiring lines and the second wiring lines, a wire connection between the Y-direction signal bus and the X-direction signal bus is changed by the first transfer gate.

5. A circuit as claimed in claim 4, wherein:

the first transfer gate comprises an n-channel enhancement type thin-film transistor or an n-channel depletion type thin-film transistor so as to structure the wire selection portion in a three-dimensional form.

6. A circuit as claimed in claim 4, wherein:

the first thin film transistor has a first gate, the first gate is connected to the memory, the memory is driven by a voltage higher than a power supply voltage.

7. A circuit as claimed in claim 4, wherein:

the programmable logic gate has an input terminal and an output terminal, the input-output switch has second transfer gates which are placed between the second wiring lines, and a wire connection between the X-direction signal bus and the input terminal and the output terminal is changed by the second transfer gate.

8. A circuit as claimed in claim 6, wherein:

the second transfer gate comprises an n-channel enhancement type thin-film transistor or an n-channel depletion type thin-film transistor so as to structure the wire selection portion in a three-dimensional form.

9. A circuit as claimed in claim 6, wherein:

the second thin film transistor has a second gate, the second gate is connected to the memory, the memory is driven by a voltage higher than a power supply voltage.

10. A circuit as claimed in claim 1, wherein:

the programmable logic gate comprises;

a switch portion which has a pair of third transfer gates, a level converter which is connected to one of the third transfer gates;

an inverter which is connected to another one of the third transfer gates, and an output buffer which is given with an output of the switch portion.

11. A circuit as claimed in claim 10, wherein:

the third transfer gate comprises an n-channel enhancement type thin-film transistor or an n-channel depletion type thin-film transistor so as to structure the logic gate portion in a three-dimensional form.

12. A circuit as claimed in claim 1, wherein:

a repeater is inserted between the basic cells.

13. A circuit as claimed in claim 1, wherein:

the basic cell comprises a neuron cell.

14. A semiconductor integrated circuit having a plurality of basic cells which are placed in a matrix form and are connected to each other via a signal bus, wherein:

each of the basic cells includes a wire selection portion and a logic gate portion having transfer gates, the logic gate portion has a fixed logic gate and a memory, the wire selection portion has a wire switch and an input switch, the wire switch is connected to the signal bus, the input switch, and the memory, the input switch is connected to the signal bus and the fixed logic gate, and the fixed logic gate is connected to the signal bus, each of the wire switch and the input switch being controlled by a data signal stored in the memory.

15. A circuit as claimed in claim 14, wherein:

the memory comprises an SRAM, a DRAM, a ROM, an EPROM, and an EEPROM.

16. A circuit as claimed in claim 14, wherein:

the transfer gate comprises an n-channel enhancement type thin-film transistor or an n-channel depletion type thin-film transistor.

17. A semiconductor integrated circuit having a plurality of basic cells which are placed in a matrix form and are connected to each other via a signal bus, wherein:

each of the basic cells includes a wire selection portion and a logic gate portion having transfer gates, the logic gate portion has a programmable logic gate and a memory, the wire selection portion has a wire switch and an input switch, the wire switch is connected to the signal bus, the input switch, and the memory, the input switch is connected to the signal bus and the programmable logic gate, and the programmable logic gate is connected to the signal bus, each of the wire switch and the input switch being controlled by a data signal stored in the memory.

18. A circuit as claimed in claim 17, wherein:

the memory comprises an SRAM, a DRAM, a ROM, an EPROM, and an EEPROM.

19. A circuit as claimed in claim 17, wherein:

the transfer gate comprises an n-channel enhancement type thin-film transistor or an n-channel depletion type thin-film transistor.

20. A semiconductor integrated circuit device having a plurality of basic cells which are placed in a matrix form and are formed on a semiconductor substrate, wherein:

each of the basic cells includes a wire selection portion and a logic gate portion, the logic gate portion has a MOS transistor, the wire selection portion has a thin-film transistor serving as a transfer gate, the wire selection portion being placed over the logic gate portion via an interlayer insulating film.

21. A device as claimed in claim 20, wherein:

the thin-film transistor comprises an n-channel enhancement type or an n-channel depletion type thin-film transistor.

22. A device as claimed in claim 20, wherein:

at least a pair of wiring patterns are formed in the interlayer insulating film, and the thin-film transistor is placed between the wiring patterns.

23. A device as claimed in claim 20, wherein:

the thin-film transistor comprises any one of a lateral type and a vertical type.

24. A device as claimed in claim 20, wherein:

the thin-film transistor has at least a channel region, and the channel region is formed by a non-doped polysilicon film.

* * * * *